US012670309B2

(12) United States Patent
Annamalai

(10) Patent No.: US 12,670,309 B2
(45) **Date of Patent: *Jun. 30, 2026**

(54) DATABASE DRIVEN PLACE AND ROUTE FOR COARSE-GRAIN RECONFIGURABLE ARCHITECTURES

(71) Applicant: SambaNova Systems, Inc., Palo Alto, CA (US)

(72) Inventor: Muthiah Annamalai, Hayward, CA (US)

(73) Assignee: SambaNova Systems, Inc., Palo Alto, CA (US)

( * ) Notice: Subject to any disclaimer, the term of this patent is extended or adjusted under 35 U.S.C. 154(b) by 780 days.

This patent is subject to a terminal disclaimer.

(21) Appl. No.: 18/092,437

(22) Filed: Jan. 2, 2023

(65) Prior Publication Data

US 2024/0220698 A1 Jul. 4, 2024

(51) Int. Cl.
 *G06F 30/392* (2020.01)
 *G06F 30/394* (2020.01)
 *G06N 3/04* (2023.01)
(52) U.S. Cl.
 CPC .......... *G06F 30/392* (2020.01); *G06F 30/394* (2020.01); *G06N 3/04* (2013.01)

(58) Field of Classification Search
 CPC ........ G06F 30/30; G06F 30/39; G06F 30/392; G06F 30/394; G06F 30/398; H10D 89/10; G06N 3/04; G06N 3/045; G06N 3/08; G06N 3/082; G06N 3/09; G06N 3/094; G06N 3/96
 USPC .......................................... 716/119
 See application file for complete search history.

(56) References Cited

U.S. PATENT DOCUMENTS

2022/0107793 A1* 4/2022 Capota ..................... G06N 3/08

* cited by examiner

*Primary Examiner* — Paul Dinh
(74) *Attorney, Agent, or Firm* — FP Patents; Sikander M. Khan; Bruce A. Young

(57) ABSTRACT

This application provides an example method, an example system, and an example non-transitory computer-readable medium for database driven place and route. One example method includes receiving an unplaced unit graph. The example method also includes classifying the unplaced unit graph against a database of previously placed reference unit graphs using a graph neural network (GNN) to identify a nearest matching previously placed reference unit graph of the database. The example method further includes placing configurable units of the unplaced unit graph onto positions in a configurable units array based on placement position attributes of at least a portion of configurable units of the nearest matching previously placed reference unit graph. The example method also includes generating configuration data that enables the configurable units array to execute at least a portion of the unplaced unit graph.

20 Claims, 17 Drawing Sheets

1100

1102
Receiving an unplaced unit graph

1104
Classifying the unplaced unit graph against a database of previously placed reference unit graphs using a graph neural network (GNN) to identify a nearest matching previously placed reference unit graph of the database 1106
Placing configurable units of the unplaced unit graph onto positions in a configurable unit array based on placement position attributes of at least a portion of configurable units of the nearest matching previously placed reference unit graph 1108
Routing data and dataflow control information between the configurable units of the unplaced unit graph placed onto positions in the configurable unit array 1110
Generating configuration data that enables the configurable unit array to execute at least a portion of the unplaced unit graph

100

300

1000                                                                FIG. 10
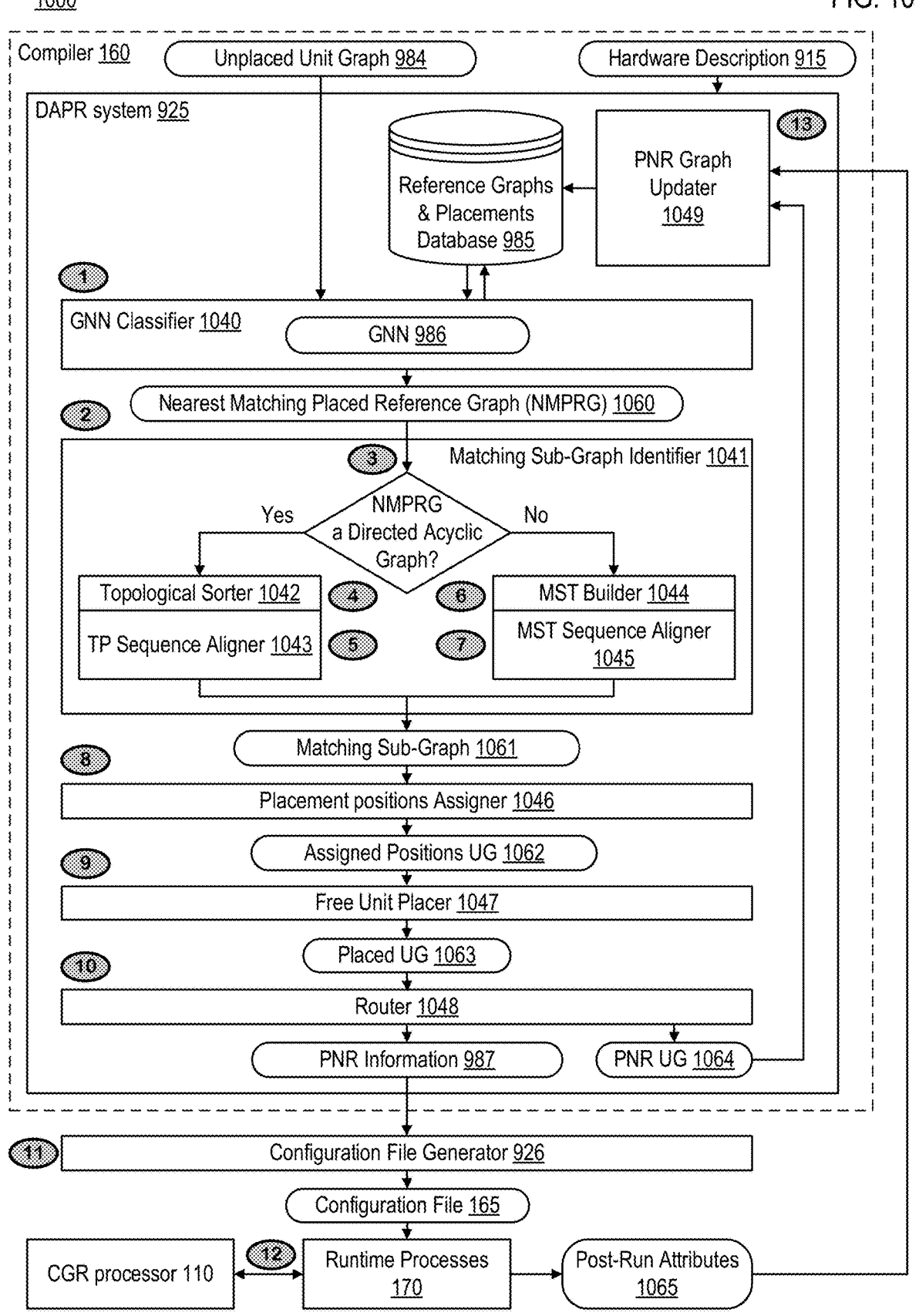

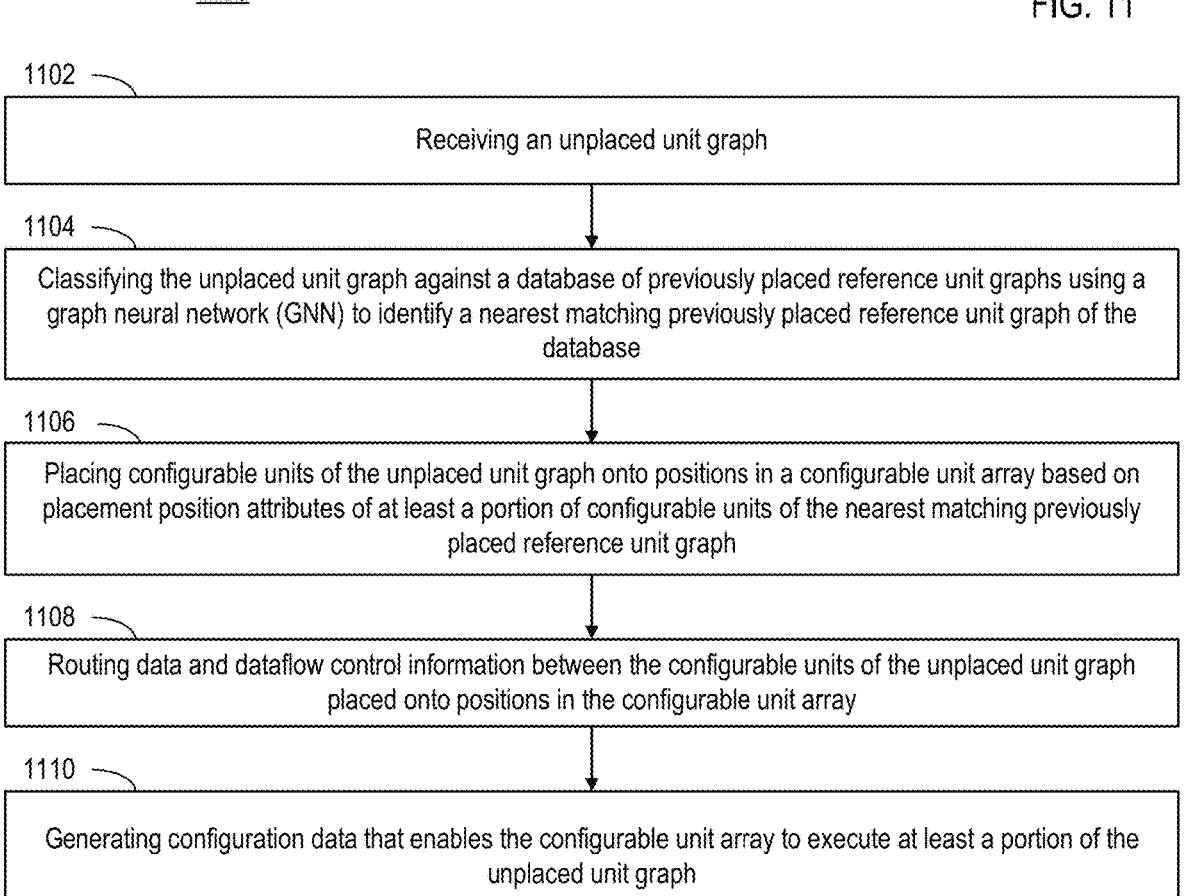

Receiving an unplaced unit graph

1104

Classifying the unplaced unit graph against a database of previously placed reference unit graphs using a graph neural network (GNN) to identify a nearest matching previously placed reference unit graph of the database

1106

Placing configurable units of the unplaced unit graph onto positions in a configurable unit array based on placement position attributes of at least a portion of configurable units of the nearest matching previously placed reference unit graph

1108

Routing data and dataflow control information between the configurable units of the unplaced unit graph placed onto positions in the configurable unit array

1110

Generating configuration data that enables the configurable unit array to execute at least a portion of the unplaced unit graph 1200                                                                    FIG. 12A
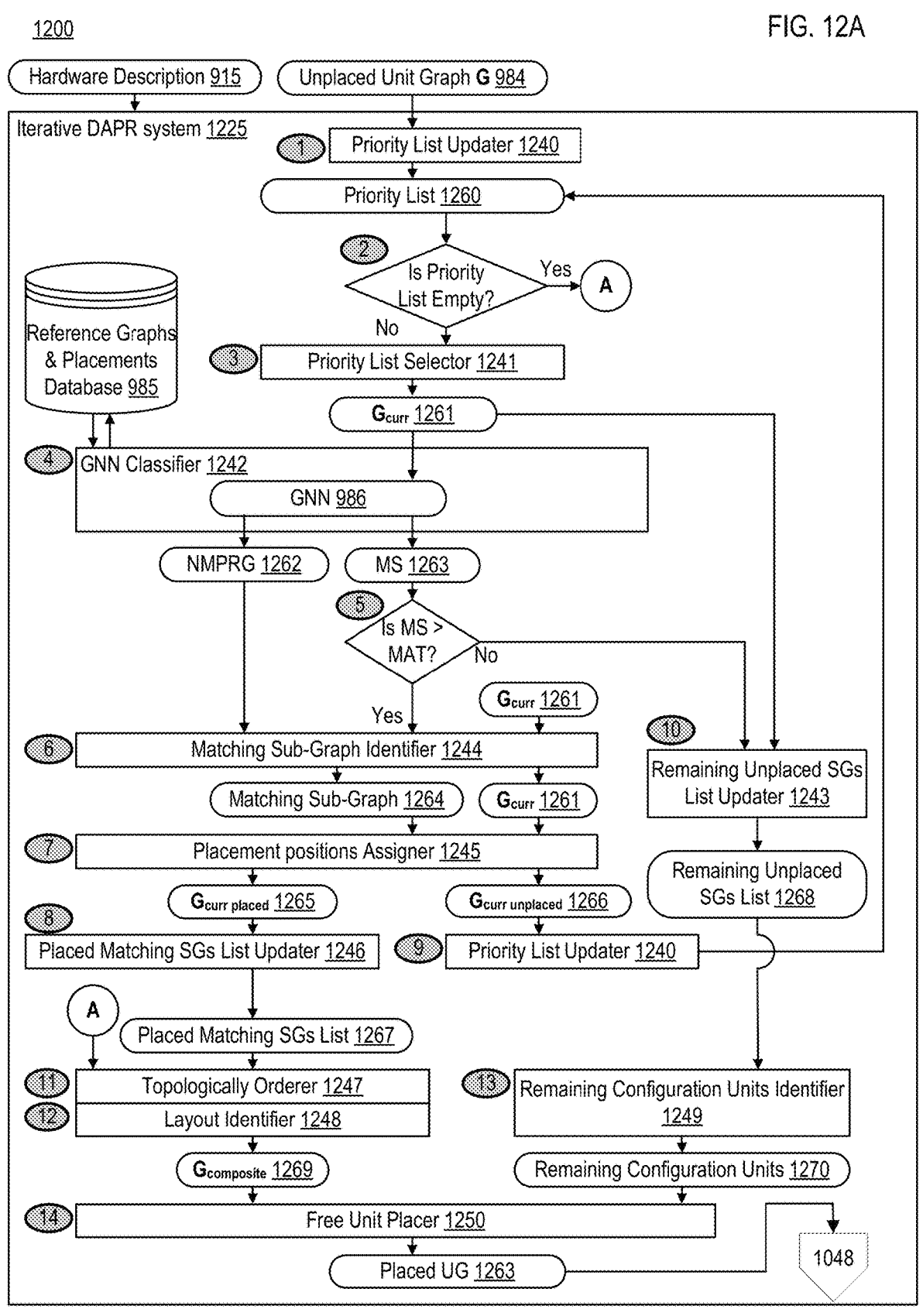

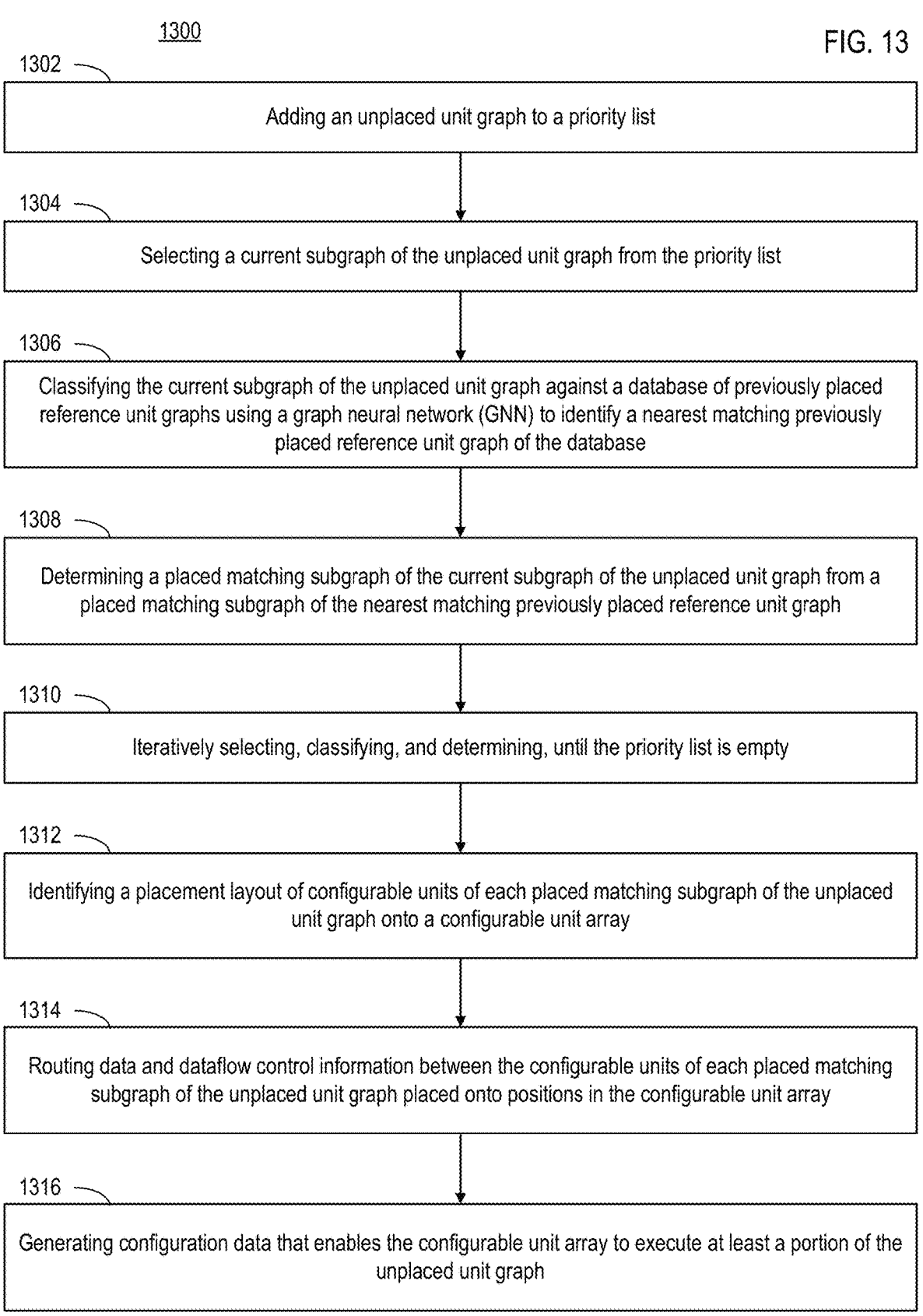

Adding an unplaced unit graph to a priority list

1304

Selecting a current subgraph of the unplaced unit graph from the priority list

1306

Classifying the current subgraph of the unplaced unit graph against a database of previously placed reference unit graphs using a graph neural network (GNN) to identify a nearest matching previously placed reference unit graph of the database

1308

Determining a placed matching subgraph of the current subgraph of the unplaced unit graph from a placed matching subgraph of the nearest matching previously placed reference unit graph

1310

Iteratively selecting, classifying, and determining, until the priority list is empty

1312

Identifying a placement layout of configurable units of each placed matching subgraph of the unplaced unit graph onto a configurable unit array

1314

Routing data and dataflow control information between the configurable units of each placed matching subgraph of the unplaced unit graph placed onto positions in the configurable unit array

1316

Generating configuration data that enables the configurable unit array to execute at least a portion of the unplaced unit graph

1400

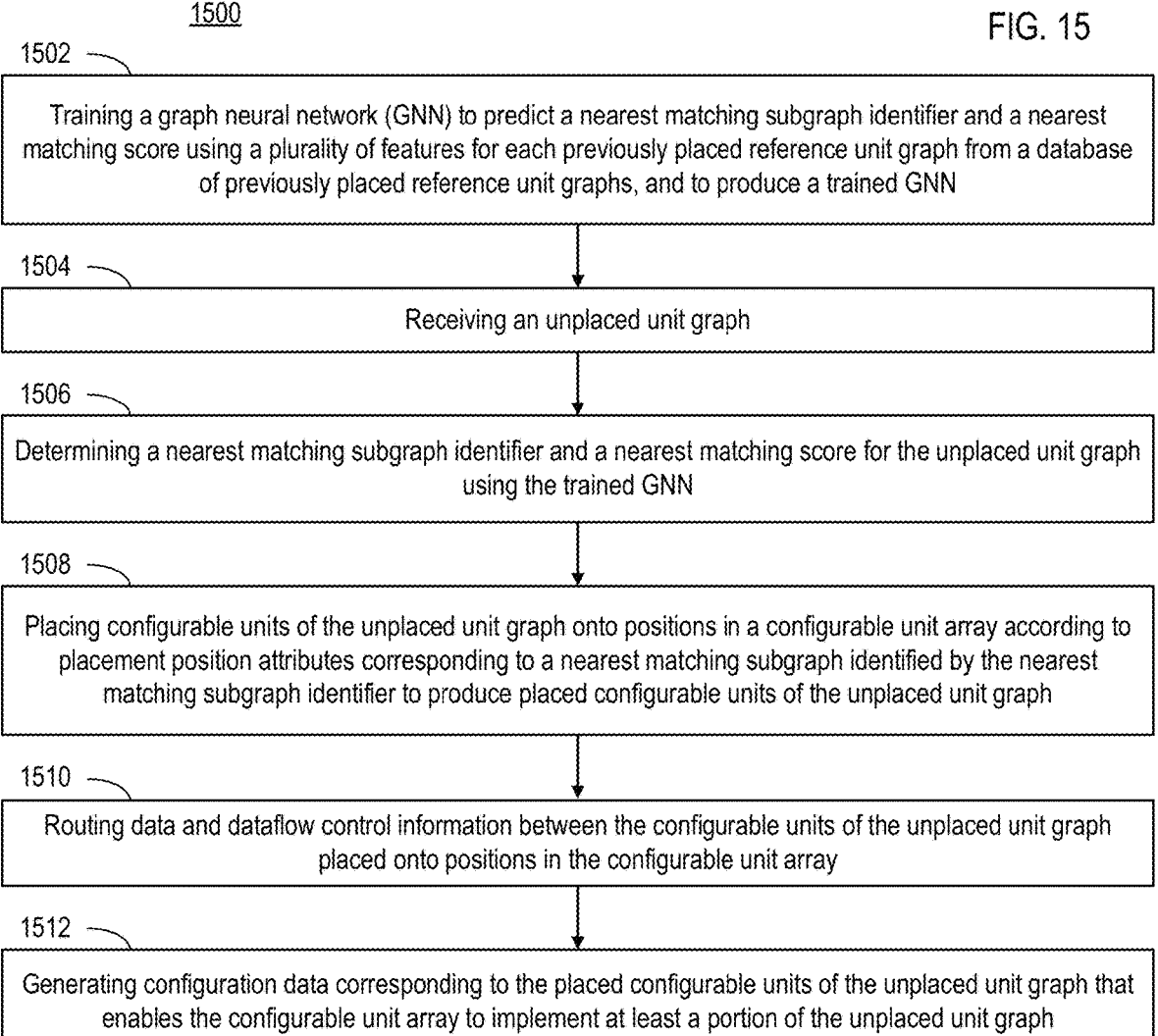

Training a graph neural network (GNN) to predict a nearest matching subgraph identifier and a nearest matching score using a plurality of features for each previously placed reference unit graph from a database of previously placed reference unit graphs, and to produce a trained GNN

1504

Receiving an unplaced unit graph

1506

Determining a nearest matching subgraph identifier and a nearest matching score for the unplaced unit graph using the trained GNN

1508

Placing configurable units of the unplaced unit graph onto positions in a configurable unit array according to placement position attributes corresponding to a nearest matching subgraph identified by the nearest matching subgraph identifier to produce placed configurable units of the unplaced unit graph

1510

Routing data and dataflow control information between the configurable units of the unplaced unit graph placed onto positions in the configurable unit array

1512

Generating configuration data corresponding to the placed configurable units of the unplaced unit graph that enables the configurable unit array to implement at least a portion of the unplaced unit graph

DATABASE DRIVEN PLACE AND ROUTE FOR COARSE-GRAIN RECONFIGURABLE ARCHITECTURES

PRIORITY DATA AND CROSS REFERENCES

This application is related to and filed in conjunction with U.S. patent application Ser. No. 18/092,439, filed on Jan. 2, 2023, entitled "ITERATIVE DATABASE DRIVEN PLACE AND ROUTE FOR COARSE-GRAIN RECONFIGUR-ABLE ARCHITECTURES", which is also related to and filed in conjunction with U.S. patent application Ser. No. 18/092,440, filed on Jan. 2, 2023, entitled "TRAINING A GRAPH NEURAL NETWORK FOR DATABASE DRIVEN PLACE AND ROUTE", which is also related to commonly owned U.S. patent application Ser. No. 17/990, 556, filed on Nov. 18, 2022, entitled "ESTIMATING THROUGHPUT FOR PLACEMENT GRAPHS FOR A RECONFIGURABLE DATAFLOW COMPUTING SYS-TEM", which is also related to commonly owned U.S. Provisional Application No. 63/282,159, filed on Nov. 22, 2021, entitled "DATA-DRIVEN COST MODELING FOR PLACEMENT AND ROUTING IN DATAFLOW ARCHI-TECTURE COMPILERS", which is also related to com-monly owned U.S. Provisional Application No. 63/406,196, filed on Sep. 23, 2022, entitled "LEARNED COST MOD-ELS FOR PERFORMANCE OPTIMIZATION ON DATA-FLOW ARCHITECTURE", the entire contents of each application and together are hereby incorporated by refer-ence. This application is further related to Prabhakar et al., entitled "Plasticine: A Reconfigurable Architecture for Par-allel Patterns," published in ISCA '17, on Jun. 24-28, 2017, Toronto, ON, Canada, which is also related to Koeplinger et al., entitled "Spatial: A Language and Compiler for Appli-cation Accelerators," published in Proceedings of the 39th ACM SIGPLAN Conference on Programming Language Design and Embodiment (PLDI), Proceedings of the 43rd International Symposium on Computer Architecture, 2018, the entire contents of each reference and together are hereby incorporated by reference.

FIELD OF THE TECHNOLOGY DISCLOSED

The technology disclosed relates to database driven place and route for reconfigurable architectures, and can be par-ticularly applied to a database driven place and route system for coarse-grain reconfigurable architecture systems and other distributed execution systems.

BACKGROUND

Reconfigurable processors can be configured to imple-ment a variety of functions more efficiently or faster than might be achieved using a general-purpose processor executing a computer program. For example, coarse-grain reconfigurable (CGR) architecture (CGRA) systems are being developed in which the configurable units in the array are more complex than used in typical, more fine-grained FPGAs, and may enable faster or more efficient dataflow execution of various classes of functions. For example, CGR processors have been proposed that can enable implemen-tation of energy-efficient accelerators for machine learning and artificial intelligence workloads. See, Prabhakar, et al., "Plasticine: A Reconfigurable Architecture for Parallel Pat-terns," ISCA '17, Jun. 24-28, 2017, Toronto, ON, Canada. A CGR system is a composition of compute and memory units that are connected in a certain topology using an interconnect fabric. It is referred to as coarse-grained recon-figurable because the reconfigurable components in the architecture operate at a coarser granularity such as instruc-tions, words, and vectors of words, compared to fine-grained, bit-level granularity commonly found in architec-tures such as FPGAs. Programmable data and control paths in CGR systems can make them a natural fit to exploit nested parallelism in applications, by connecting the recompute and memory units into customized, deeply nested, and hierar-chical pipelines.

Achieving faster or more efficient dataflow execution of various classes of function depend on the compiler technol-ogy. A CGRA compiler is much more complex than a regular compiler because it has to (i) perform code analysis to extract task, data, and pipelined parallelism at multiple levels of nesting, (ii) partition and schedule operations in both space and time on the configurable units, (iii) place the operations onto the configurable units, and (iv) route the data and dataflow control information between the configurable units. Reducing compile time and achieving more efficient dataflow execution of various classes of function depends on how well a particular CGRA compiler performs these tasks.

SUMMARY

The present disclosure describes a database driven place and route system for database driven place and route for coarse-grain reconfigurable architectures. The database driven place and route system utilizes empirically validated known reference graphs and their placements onto a coarse-grain reconfigurable architecture system in the form of a database, and applies the database for techniques to place unknown and unplaced unit graphs.

In an implementation, a computer-implemented method is used for database driven place and route (DAPR) for coarse-grain reconfigurable architectures (CGRA). An unplaced unit graph is received. The unplaced unit graph is classified against a database of previously placed reference unit graphs using a graph neural network (GNN) to identify a nearest matching previously placed reference unit graph of the database. Configurable units of the unplaced unit graph are placed onto positions in a configurable units array based on placement position attributes of at least a portion of config-urable units of the nearest matching previously placed reference unit graph. Configuration data is generated that enables the configurable units array to execute at least a portion of the unplaced unit graph.

The described subject matter can be implemented using a computer-implemented method; a non-transitory, computer-readable medium storing computer-readable instructions to perform the computer-implemented method; and a com-puter-implemented system comprising one or more com-puter memory devices interoperably coupled with one or more computers and having tangible, non-transitory, machine-readable media storing instructions that, when executed by the one or more computers, perform the com-puter-implemented method/the computer-readable instruc-tions stored on the non-transitory, computer-readable medium.

The details of one or more implementations of the subject matter of this specification are set forth in the Detailed Description, the Claims, and the accompanying drawings. Other features, aspects, and advantages of the subject matter will become apparent to those of ordinary skill in the art from the Detailed Description, the Claims, and the accom-panying drawings.

BRIEF DESCRIPTION OF THE DRAWINGS

The technology disclosed are described with reference to the drawings, in which:

FIG. 10 is a sequence diagram of an example database driven place and route system for placement and routing of a unit graph onto a configurable units array.

FIG. 11 is a flowchart illustrating an example of a computer-implemented method for database driven place and route.

FIGS. 12A and 12B illustrate a sequence diagram of an example iterative database driven place and route system for placement and routing of a unit graph onto a configurable units array.

FIG. 13 is a flowchart illustrating an example of a computer-implemented method for iterative database driven place and route.

FIG. 15 is a flowchart illustrating an example of a computer-implemented method for training a GNN using reference unit graphs and their placement and routing.

In the figures, like reference numbers may indicate functionally similar elements. The systems and methods illustrated in the figures, and described in the Detailed Description, may be arranged and designed in a wide variety of different implementations. Neither the figures nor the Detailed Description are intended to limit the scope as claimed. Instead, they merely represent examples of different implementations of the disclosed technology.

DETAILED DESCRIPTION

The following detailed description describes a database driven place and route system for database driven place and route for coarse-grain reconfigurable architecture systems.

For the purposes of this disclosure, a CGRA compiler may (i) perform code analysis to extract task, data, and pipelined parallelism at multiple levels of nesting, (ii) partition and schedule operations in both space and time on the configurable units, (iii) place the operations onto the configurable units, and (iv) route the data and dataflow control information between the configurable units.

In a typical approach, an ab-initio placer is utilized to perform the placement task to place the operations onto the configurable units, which may account for a significant amount of the overall compile time.

In contrast to the typical approach utilizing an ab-initio placer to place the operations onto the configurable units for a CGR system, a DAPR system for DAPR for CGR systems is disclosed herein. The DAPR system may more efficiently perform the placement task, which may result in a reduction of time to perform the placement task and a reduction in the overall compile time. The DAPR system includes a database of placed reference unit graphs and their placements and routing. Each of the reference unit graphs and their placements and routing are known PNR solutions that have been executed on the CGR system. The DAPR system classifies a user unit graph against the database of placed reference unit graphs utilizing a graph neural network (GNN) to identify a matching subgraph of a placed reference unit graph having the highest nearness metric in the database. The DAPR system assigns the placement position attributes of the configurable units of the matching subgraph of the placed reference unit graph to position attributes of the corresponding units of the user unit graph. The DAPR system may use an ab-initio placer to place the remaining unmatched configurable units of the user unit graph to complete the placement task.

Figure 1:
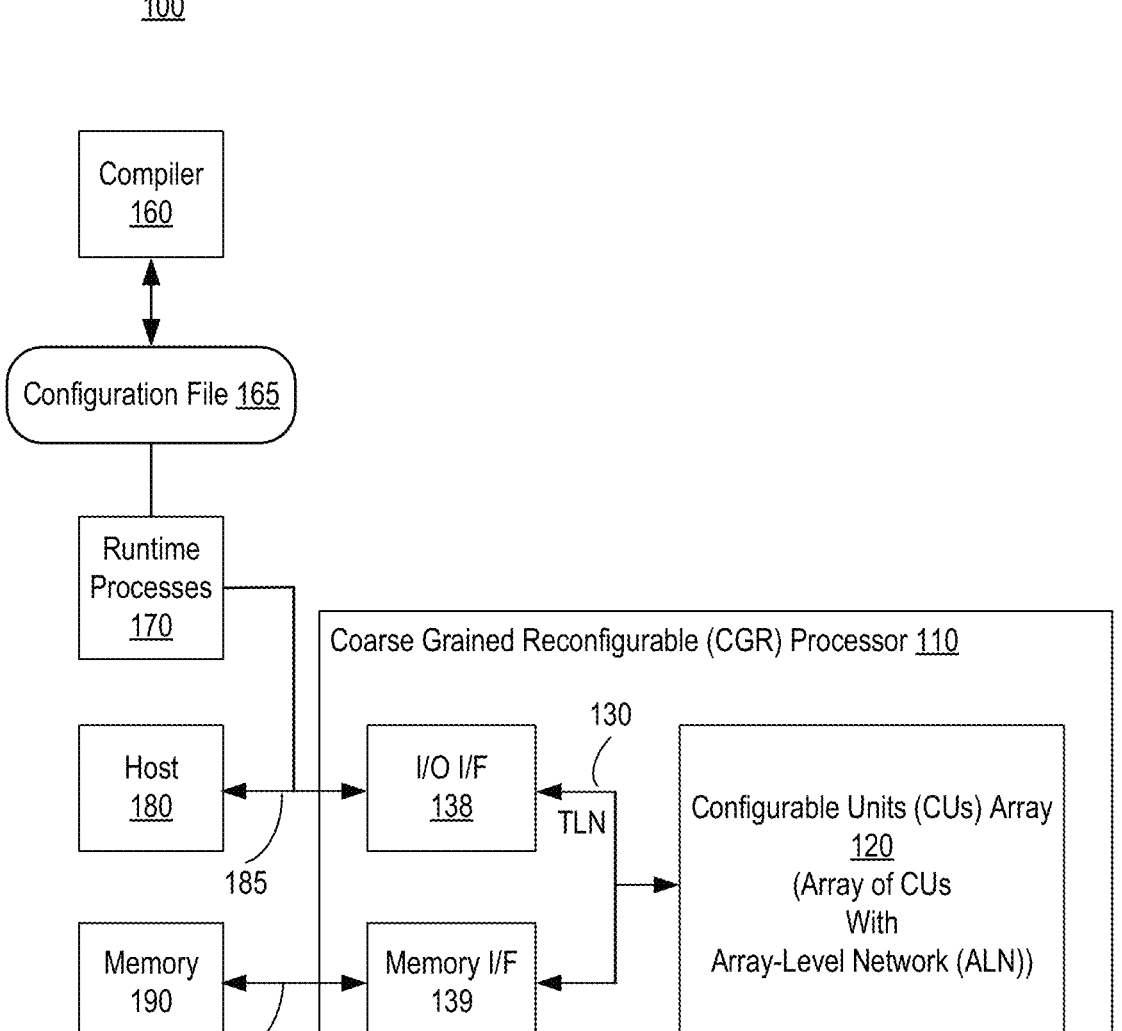
FIG. 1 illustrates an example coarse-grained reconfigurable architecture (CGRA) system including a coarse-grained reconfigurable (CGR) processor, a compiler, runtime processes, a host, and a memory.

FIG. 1 illustrates an example coarse-grained reconfigurable architecture (CGRA) system 100 including a coarse-grained reconfigurable (CGR) processor 110, a compiler 160, runtime processes 170, a host 180, and a memory 190. CGR processor 110 includes a configurable units array such as a configurable units array 120. Configurable units array 120 includes an array of configurable units in an array level network. CGR processor 110 further includes an IO interface 138, and a memory interface 139. Configurable units array 120 is coupled with IO interface 138 and memory interface 139 through a data bus 130 which may be part of a top-level network (TLN). Host 180 communicates with IO interface 138 using a system data bus 185, and memory interface 139 communicates with memory 190 using a memory bus 195. A configurable unit in the configurable units array 120 may comprise a compute unit or a memory unit. A configurable unit in the configurable units array 120 may also comprise a pattern memory unit (PMU), a pattern compute unit (PCU), or a fused-compute memory unit (FCMU). Further examples include a coalescing unit (CU) and an address generator (AG), which may be combined in an AGCU. A configurable unit may also be reconfigurable.

The configurable units in the configurable units array 120 may be connected with an array-level network (ALN) to provide the circuitry for execution of a computation graph or a dataflow graph that may have been derived from a high-level program with user algorithms and functions. The high-level program may include a set of procedures, such as learning or inferencing in an artificial intelligence (AI) or machine learning (ML) system. More specifically, the high-level program may include applications, graphs, application graphs, user applications, computation graphs, control flow graphs, dataflow graphs, models, deep learning applications, deep learning neural networks, programs, program images, jobs, tasks and/or any other procedures and functions that may need serial and/or parallel processing. In some implementations, execution of the graph(s) may involve using multiple CGR processors 110. In some implementations, CGR processor 110 may include one or more ICs. In other implementations, a single IC may span multiple CGR processors 110. In further implementations, CGR processor 110 may include multiple configurable units arrays 120.

Host 180 may be, or include, a computer such as further described with reference to FIG. 2. Host 180 runs runtime processes 170, as further referenced herein, and may also be used to run computer programs, such as compiler 160 further described herein with reference to FIG. 9. In some implementations, compiler 160 may run on a computer that is similar to the computer described with reference to FIG. 2 but separate from host 180.

CGR processor 110 may accomplish computational tasks by executing a configuration file 165. Configuration file 165 may comprise a processor-executable format file suitable for configuring a configurable units array 120 of a CGR processor 110. For the purposes of this description, a configuration file corresponds to a dataflow graph, or a translation of a dataflow graph, and may further include initialization data. Compiler 160 compiles the high-level program to provide the configuration file165. In some implementations described herein, a configurable units array 120 is configured by programming one or more configuration stores with all or parts of the configuration file 165. A single configuration store may be at the level of the CGR processor 110 or the configurable units array 120, or a configurable unit may include an individual configuration store. The configuration file 165 may include configuration data for the configurable units array 120 and the configurable units in the configurable units array 120 and link the computation graph to the configurable units array 120. Execution of the configuration file 165 by CGR processor 110 causes the configurable units 120 array(s) to implement the user algorithms and functions in the dataflow graph.

CGR processor 110 can be implemented on a single integrated circuit die or on a multichip module (MCM). An IC can be packaged in a single chip module or a multichip module. An MCM is an electronic package that may comprise multiple IC dies and other devices, assembled into a single module as if it were a single device. The various dies of an MCM may be mounted on a substrate, and the bare dies of the substrate are electrically coupled to the surface or to each other using for some examples, wire bonding, tape bonding or flip-chip bonding.

Figure 2:
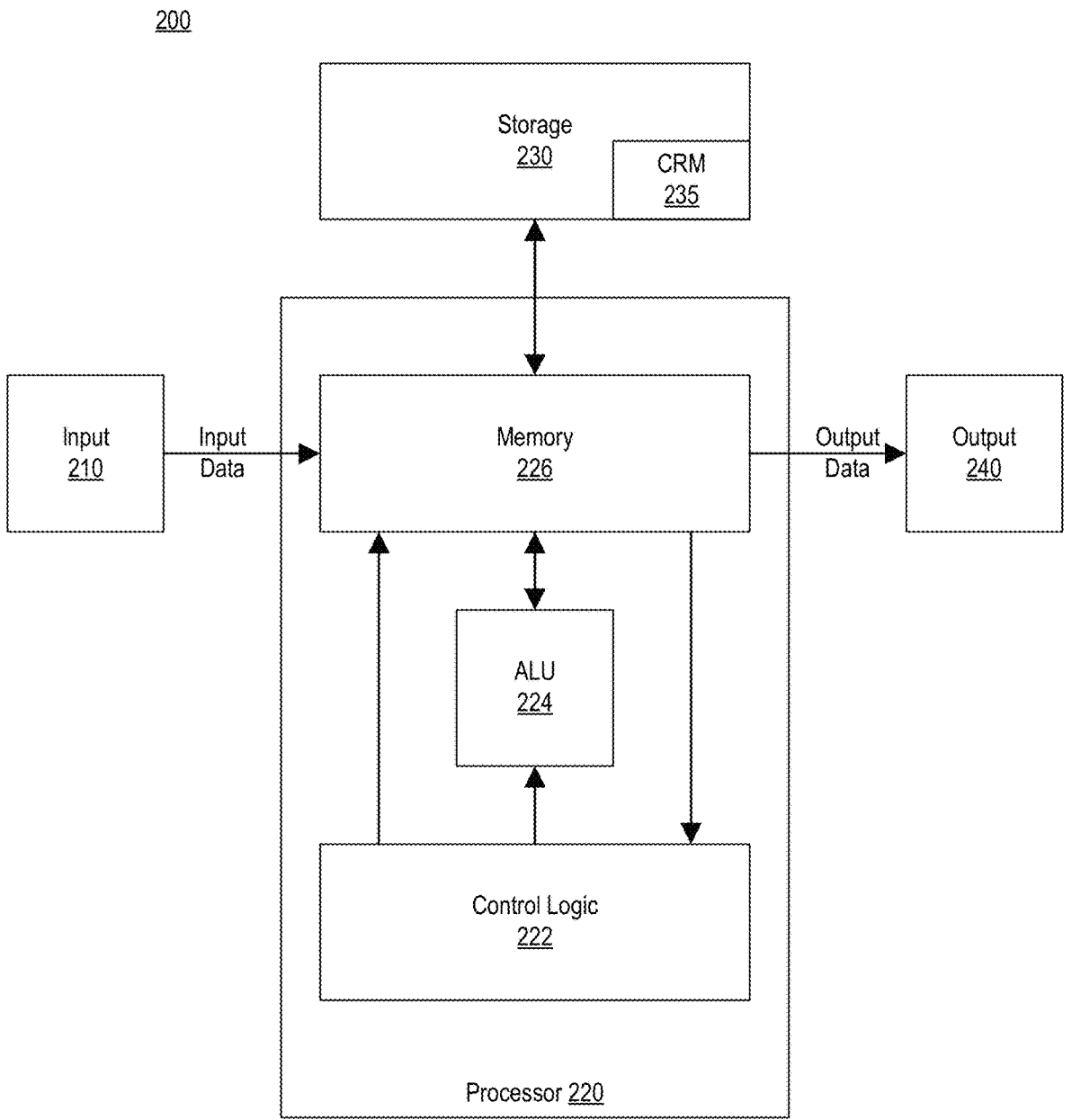
FIG. 2 illustrates an example of a computer including an input device, a processor, a storage device, and an output device.

FIG. 2 illustrates an example of a computer 200, including an input device 210, a processor 220, a storage device 230, and an output device 240. Although the example computer 200 is drawn with a single processor, other implementations may have multiple processors. Input device 210 may comprise a mouse, a keyboard, a sensor, an input port (for example, a universal serial bus (USB) port), and any other input device known in the art. Output device 240 may comprise a monitor, printer, and any other output device known in the art. Furthermore, part or all of input device 210 and output device 240 may be combined in a network interface, such as a Peripheral Component Interconnect Express (PCIe) interface suitable for communicating with CGR processor 110. Input device 210 is coupled with processor 220 to provide input data, which an implementation may store in memory 226. Processor 220 is coupled with output device 240 to provide output data from memory 226 to output device 240. Processor 220 further includes control logic 222, operable to control memory 226 and arithmetic and logic unit (ALU) 224, and to receive program and configuration data from memory 226. Control logic 222 further controls exchange of data between memory 226 and storage device 230. Memory 226 typically comprises memory with fast access, such as static random-access memory (SRAM), whereas storage device 230 typically comprises memory with slow access, such as dynamic random-access memory (DRAM), flash memory, magnetic disks, optical disks, and any other memory type known in the art. At least a part of the memory in storage device 230 includes a non-transitory computer-readable medium (CRM 235), such as used for storing computer programs.

Figure 3:
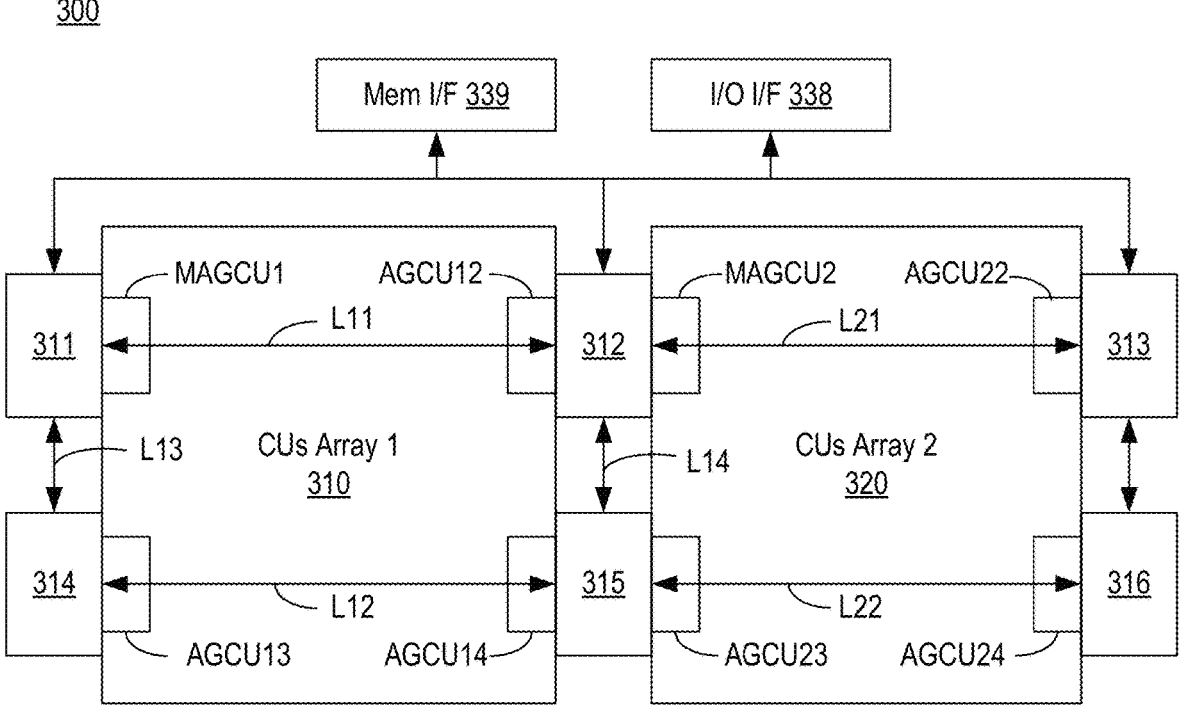
FIG. 3 illustrates example details of a CGR system including a top-level network (TLN) and two configurable units array.

FIG. 3 illustrates example details of a CGR architecture 300 including a top-level network (TLN 330) and two configurable units arrays (configurable units array 310 and configurable units array 320). A configurable units array comprises a configurable unit (such as, PMUs, PCUs, FCMUs) coupled using an array-level network (ALN), for example, a bus system. The ALN is coupled with the TLN 330 through several AGCUs, and consequently with I/O interface 338 (or any number of interfaces) and memory interface 339. Other implementations may use different bus or communication architectures.

Circuits on the TLN in this example include one or more external I/O interfaces, including I/O interface 338 and memory interface 339. The interfaces to external devices include circuits for routing data among circuits coupled with the TLN and external devices, such as high-capacity memory, host processors, other CGR processors, FPGA devices, and so on, that are coupled with the interfaces.

Each depicted configurable units array has four AGCUs (including, MAGCU1, AGCU12, AGCU13, and AGCU14 in configurable units array 310). The AGCUs interface the TLN to the ALNs and route data from the TLN to the ALN or vice versa.

One of the AGCUs in each configurable units array in this example is configured to be a master AGCU (MAGCU), which includes an array configuration load/unload controller for the configurable units array. The MAGCU1 includes a configuration load/unload controller for configurable units array 310, and MAGCU2 includes a configuration load/unload controller for configurable units array 320. Some implementations may include more than one array configuration load/unload controller. In other implementations, an array configuration load/unload controller may be implemented by logic distributed among more than one AGCU. In yet other implementations, a configuration load/unload controller can be designed for loading and unloading configuration of more than one configurable units array. In further implementations, more than one configuration controller can be designed for configuration of a single configurable units array. Also, the configuration load/unload controller can be implemented in other portions of the system, including as a stand-alone circuit on the TLN and the ALN or ALNs.

The TLN is constructed using top-level switches (switch 311, switch 312, switch 313, switch 314, switch 315, and switch 316) coupled with each other as well as with other circuits on the TLN, including the AGCUs, and external I/O interface 338. The TLN includes links (for example, L11, L12, L21, L22) coupling the top-level switches. Data may travel in packets between the top-level switches on the links, and from the switches to the circuits on the network coupled with the switches. For example, switch 311 and switch 312 are coupled by link L11, switch 314 and switch 315 are coupled by link L12, switch 311 and switch 314 are coupled by link L13, and switch 312 and switch 313 are coupled by link L21. The links can include one or more buses and supporting control lines, including for example a chunk-wide bus (vector bus). For example, the top-level network can include data, request and response channels operable in coordination for transfer of data in any manner known in the art.

Figure 4:
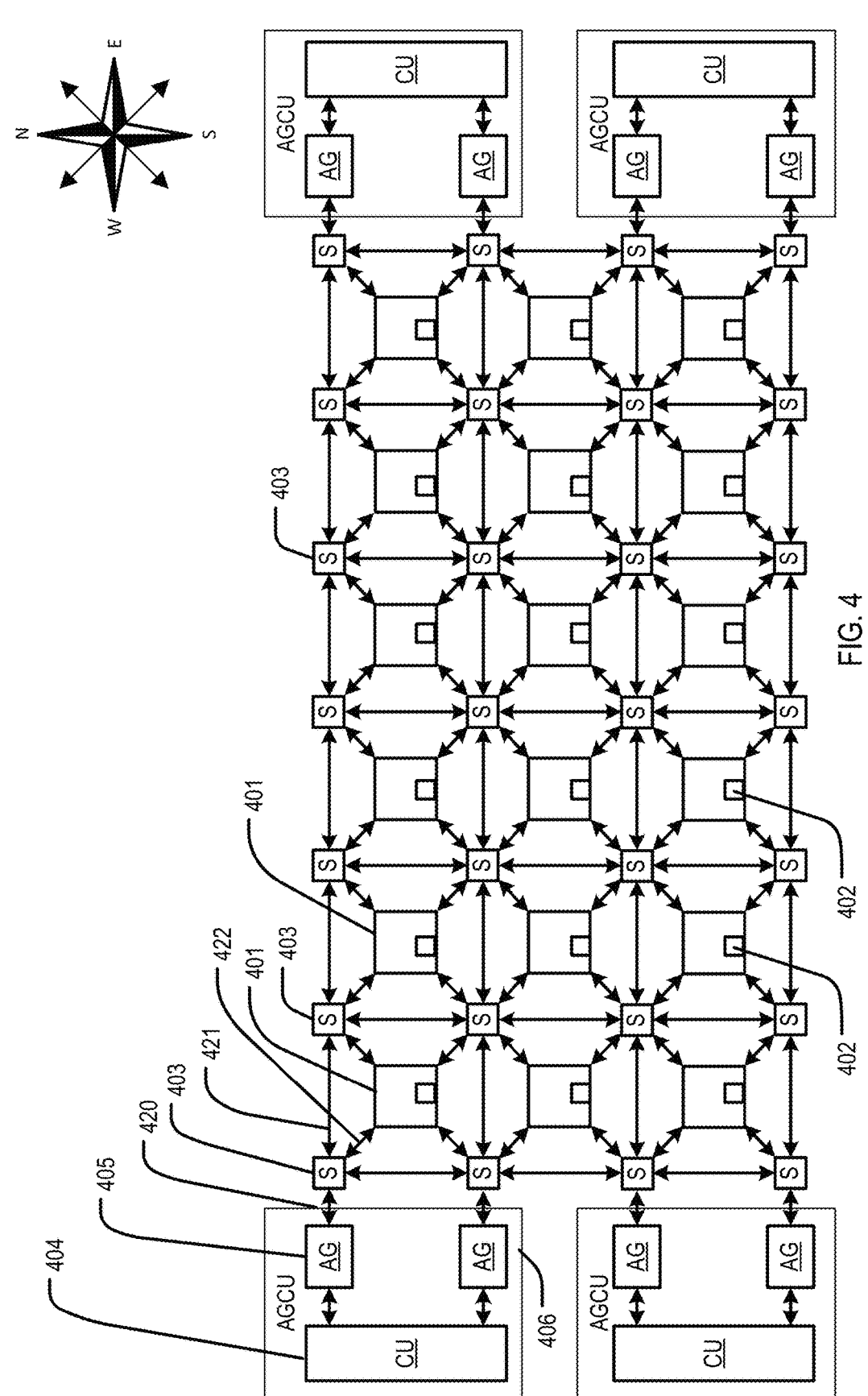
FIG. 4 illustrates an example of a configurable units array in an array-level network (ALN).

FIG. 4 illustrates an example configurable units array 400, including a configurable units array in an ALN. Configurable units array 400 may include several types of configurable unit 401, such as FCMUs, PMUs, PCUs, memory units, and/or compute units. For examples of the functions of these types of configurable units, see Prabhakar et al., "Plasticine: A Reconfigurable Architecture for Parallel Patterns", ISCA 2017, Jun. 24-28, 2017, Toronto, ON, Canada. Each of the configurable units may include a configuration store 402 comprising a set of registers or flip-flops storing configuration data that represents the setup and/or the sequence to run a program, and that can include the number of nested loops, the limits of each loop iterator, the instructions to be executed for each stage, the source of operands, and the network parameters for the input and output interfaces. In some implementations, each configurable unit 401 comprises an FCMU. In other implementations, the array comprises both PMUs and PCUs, or memory units and compute units, arranged in a checkerboard pattern. In yet other implementations, configurable units may be arranged in different patterns. The ALN includes switch units 403 (S), and AGCUs (each including two address generators 405 (AG) and a shared coalescing unit 404 (CU)). Switch units 403 are connected among themselves using interconnects 421 and to a configurable unit 401 with interconnects 422. Switch units 403 may be coupled with address generators 405 using interconnects 420. In some implementations, communication channels can be configured as end-to-end connections, and switch units 403 are configurable units. In other implementations, switches route data using the available links based on address information in packet headers, and communication channels establish as and when needed.

A configuration file may include configuration data representing an initial configuration, or starting state, of each of the configurable units that execute a high-level program with user algorithms and functions. Program load is the process of setting up the configuration stores in the configurable units array based on the configuration data to allow the configurable units to execute the high-level program. Program load may also require loading memory units and/or PMUs.

The ALN includes one or more kinds of physical data buses, for example a chunk-level vector bus (for instance, 512 bits of data), a word-level scalar bus (for example, 32 bits of data), and a control bus. For instance, interconnects 421 between two switches may include a vector bus interconnect with a bus width of 512 bits, and a scalar bus interconnect with a bus width of 32 bits. A control bus can comprise a configurable interconnect that carries multiple control bits on signal routes designated by configuration bits in the configurable units array's configuration file. The control bus can comprise physical lines separate from the data buses in some implementations. In other implementations, the control bus can be implemented using the same physical lines with a separate protocol or in a time-sharing procedure.

Physical data buses may differ in the granularity of data being transferred. In one implementation, a vector bus can carry a chunk that includes 16 channels of 32-bit floating-point data or 32 channels of 16-bit floating-point data (that is, 512 bits) of data as its payload. A scalar bus can have a 32-bit payload and carry scalar operands or control information. The control bus can carry control handshakes such as tokens and other signals. The vector and scalar buses can be packet-switched, including headers that indicate a destination of each packet and other information such as sequence numbers that can be used to reassemble a file when the packets are received out of order. Each packet header can contain a destination identifier that identifies the geographical coordinates of the destination switch unit (such as, the row and column in the array), and an interface identifier that identifies the interface on the destination switch (for example, North, South, East, West, among others) used to reach the destination unit.

A configurable unit 401 may have four ports (as drawn) to interface with switch units 403, or any other number of ports suitable for an ALN. Each port may be suitable for receiving and transmitting data, or a port may be suitable for only receiving or only transmitting data.

A switch unit, as shown in the example of FIG. 4, may have eight interfaces. The North, South, East and West interfaces of a switch unit may be used for links between switch units using interconnects 421. The Northeast, Southeast, Northwest and Southwest interfaces of a switch unit may each be used to make a link with an FCMU, PCU or PMU instance using one of the interconnects 422. Two switch units in each configurable units array quadrant have links to an AGCU using interconnects 420. The AGCU coalescing unit arbitrates between the AGs and processes memory requests. Each of the eight interfaces of a switch unit can include a vector interface, a scalar interface, and a control interface to communicate with the vector network, the scalar network, and the control network. In other implementations, a switch unit may have any number of interfaces.

During execution of a graph or subgraph in a configurable units array after configuration, data can be sent using one or more switch units and one or more links between the switch units to the configurable units using the vector bus and vector interface(s) of the one or more switch units on the ALN. A configurable units array may comprise at least a part of configurable units array 400, and any number of other configurable units arrays coupled with configurable units array 400.

A data processing operation implemented by configurable units array configuration may comprise multiple graphs or subgraphs specifying data processing operations that are distributed among and executed by corresponding configurable units (including, FCMUs, PMUs, PCUs, AGs, and CUs).

Figure 5:
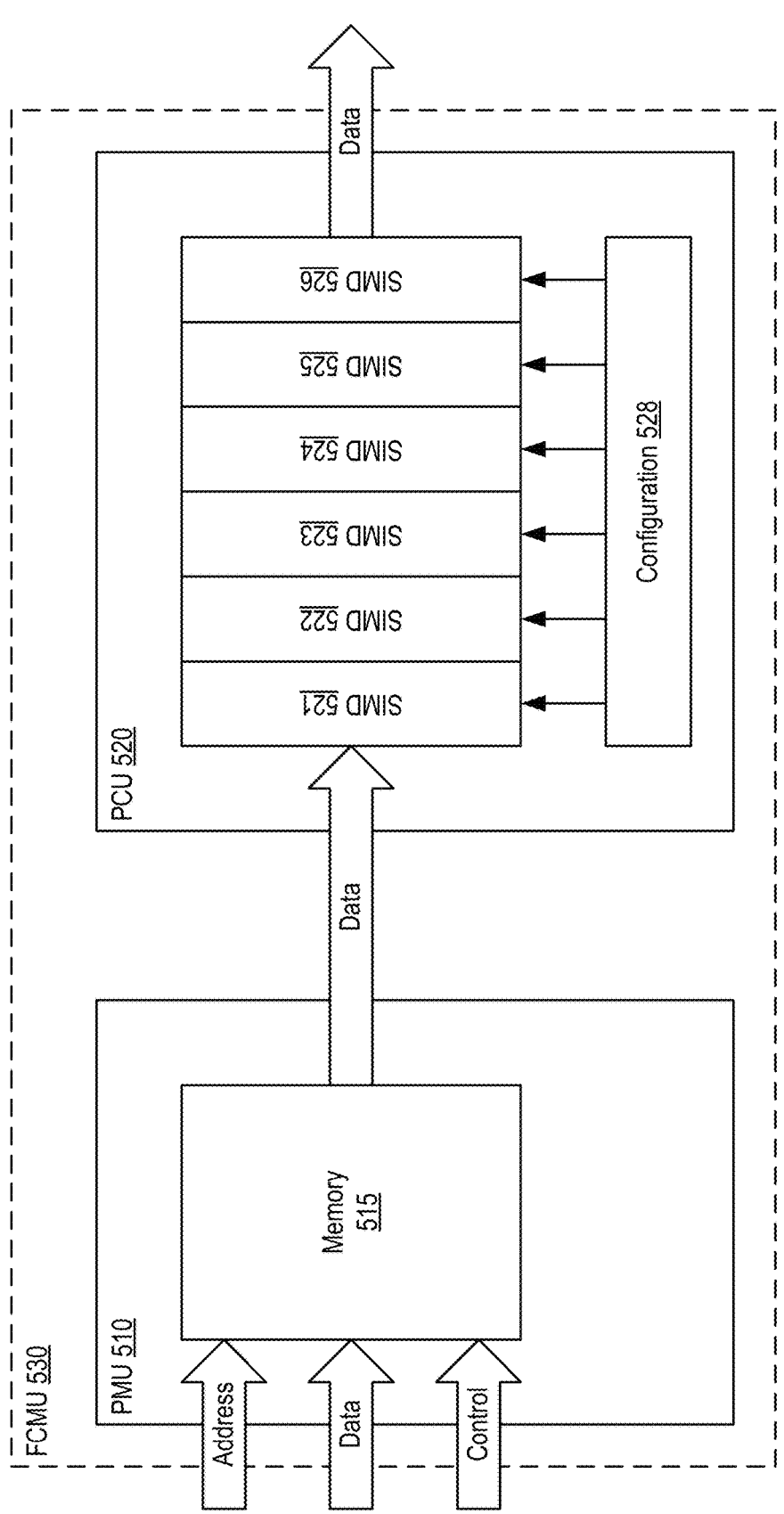
FIG. 5 illustrates an example of a pattern memory unit (PMU) and a pattern compute unit (PCU), which may be combined in a fused-control memory unit (FCMU).

FIG. 5 illustrates an example 500 of a PMU 510 and a PCU 520, which may be combined in an FCMU 530. PMU 510 may be directly coupled to PCU 520, or optionally using one or more switches. PMU 510 includes a scratchpad memory 515, which may receive external data, memory addresses, and memory control information (write enable, read enable) using one or more buses included in the ALN. PCU 520 includes two or more processor stages, such as SIMD 521 through SIMD 526, and configuration store 528. The processor stages may include ALUs, or SIMDs, as drawn, or any other reconfigurable stages that can process data.

Each stage in PCU 520 may also hold one or more registers (not drawn) for short-term storage of parameters. Short-term storage, for example during one to several clock cycles or unit delays, allows for synchronization of data in the PCU pipeline.

Figure 6:
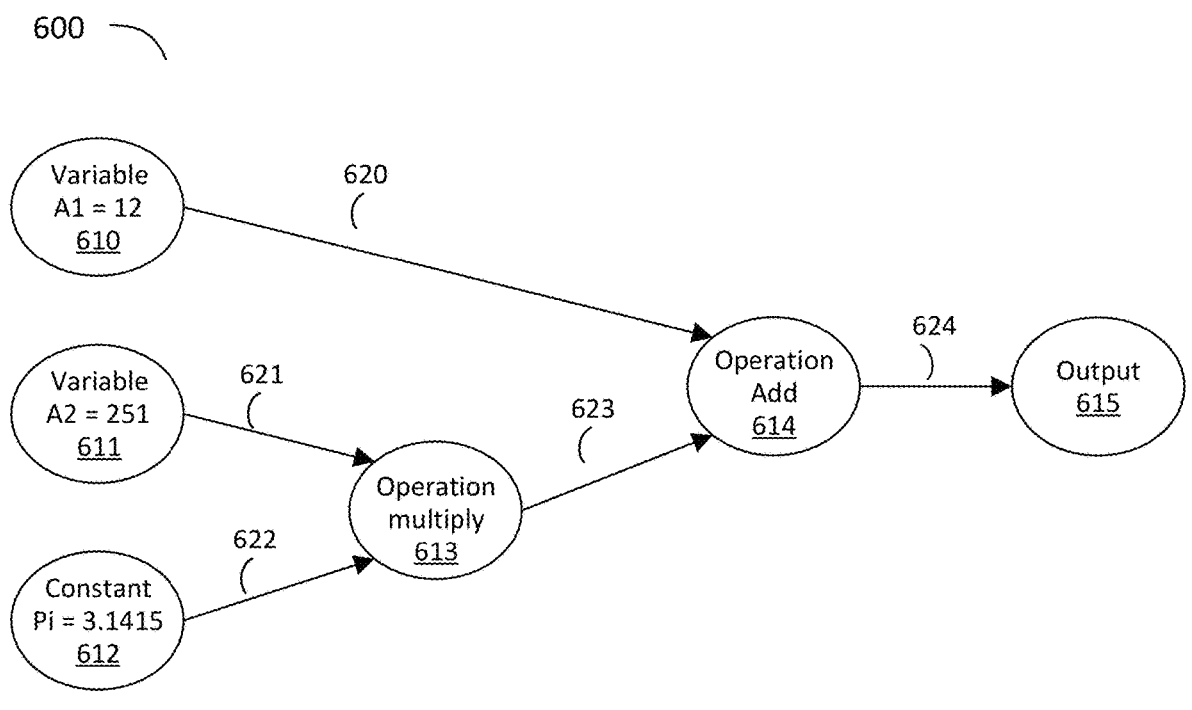
FIG. 6 illustrates an example of a computation graph.

FIG. 6 shows an example of a computation graph 600. Computation graphs represent mathematical expressions and comprise nodes and directed edges. In FIG. 6, nodes are drawn as circles and directed edges are drawn as arrows. A node can represent a constant, a variable, for example from an input, an operation, an equation, or an output value. A directed edge can represent a dependency. Node 610 represents a variable A1, whose present value equals 12. Node 611 represents a variable A2, whose present value equals 251. Node 612 represents the constant π. Node 613 represents a multiplication operation. It receives its input data from node 611 using directed edge 621 and from node 612 using directed edge 622. Node 614 represents an addition operation. Node 614 receives its input data from node 610 using directed edge 620 and from node 613 using directed edge 623. Node 614 outputs its result in output node 615 using directed edge 624. Computation graph 600 as a whole represents the equation Output=A1+pi*A2.

The depicted computation graph 600 is very simple and could be implemented electronically in many ways. For example, it could be hardwired as a circuit of digital gates in an application-specific IC (ASIC), or an FPGA could be configured to emulate the circuit of digital gates, or a CGR processor could be configured to perform the addition and multiplication functions, or a CPU could run a conventional computer program to perform the functions. In all implementations, the timing is important. Node 614 is not able to calculate a valid output value until all its input values are valid. That means node 613 must be finished first. Most digital circuits are implemented as pipelines of clocked stages. If the add operation of node 614 is in a later stage than the multiplication operation of node 613, then a fixed-delay buffer may need to be inserted between node 610 and node 614 to synchronize the value of variable A1 with the result of the multiplication in node 613. The fixed-delay buffer can be added to the graph to make it physically implementable.

Most computation graphs are a-cyclic, that is, they don't include loops. One class of computation graphs, dataflow graphs, may include loops, and even nested loops. This can make delays of operations performed by nodes variable, dependent on the data flowing through a pipeline of operations. When a high-level program includes multiple pipelines of parallel, interdependent operations, then synchronization can become highly complex. Synchronization can be further complicated when directed edges are implemented as data channels in a network, since the data channels can become congested. A CGR processor, may resolve both problems by using dataflow control information, sent as messages from consuming nodes to producing nodes to indicate that the consuming node is ready to receive the information, and a credit token system that prevents congestion of the data channels between the producing and consuming nodes.

Figure 7:
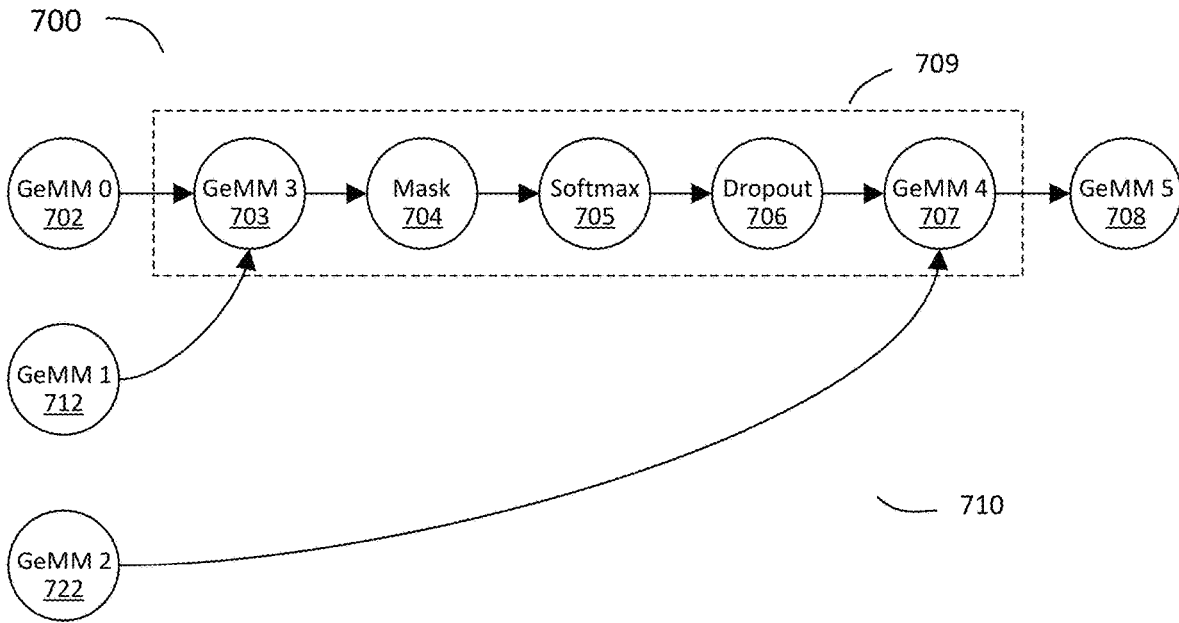
FIG. 7 illustrates an example of a dataflow graph.

FIG. 7 shows an example of a dataflow graph 700. This example, one head of a multi-head attention module in the Transformer model first published by Vaswani, et al., "Attention Is All You Need," 31st Conference on Neural Information Processing Systems, 2017, is well known in the industry. It includes a loop 709 within a loop 710. Loop 710 includes four general matrix multiplications, GeMM 702, GeMM 712, GeMM 722, and GeMM 708. Loop 709 includes an ingress matrix multiplication GeMM 703, mask fill node 704, softmax node 705, dropout node 706, and egress matrix multiplication node 707.

To physically implement dataflow graph 700, an implementation may insert three types of stage buffers: (1) inter-stage buffers, (2) intra-stage buffers, and (3) interface buffers. The interface buffers are used because the granularity of communication (that is, the size of tensors or data produced or consumed) varies between loops at different levels. Further, an implementation must add dataflow control information, to synchronize the various stages of asynchronous computation.

Figure 8:
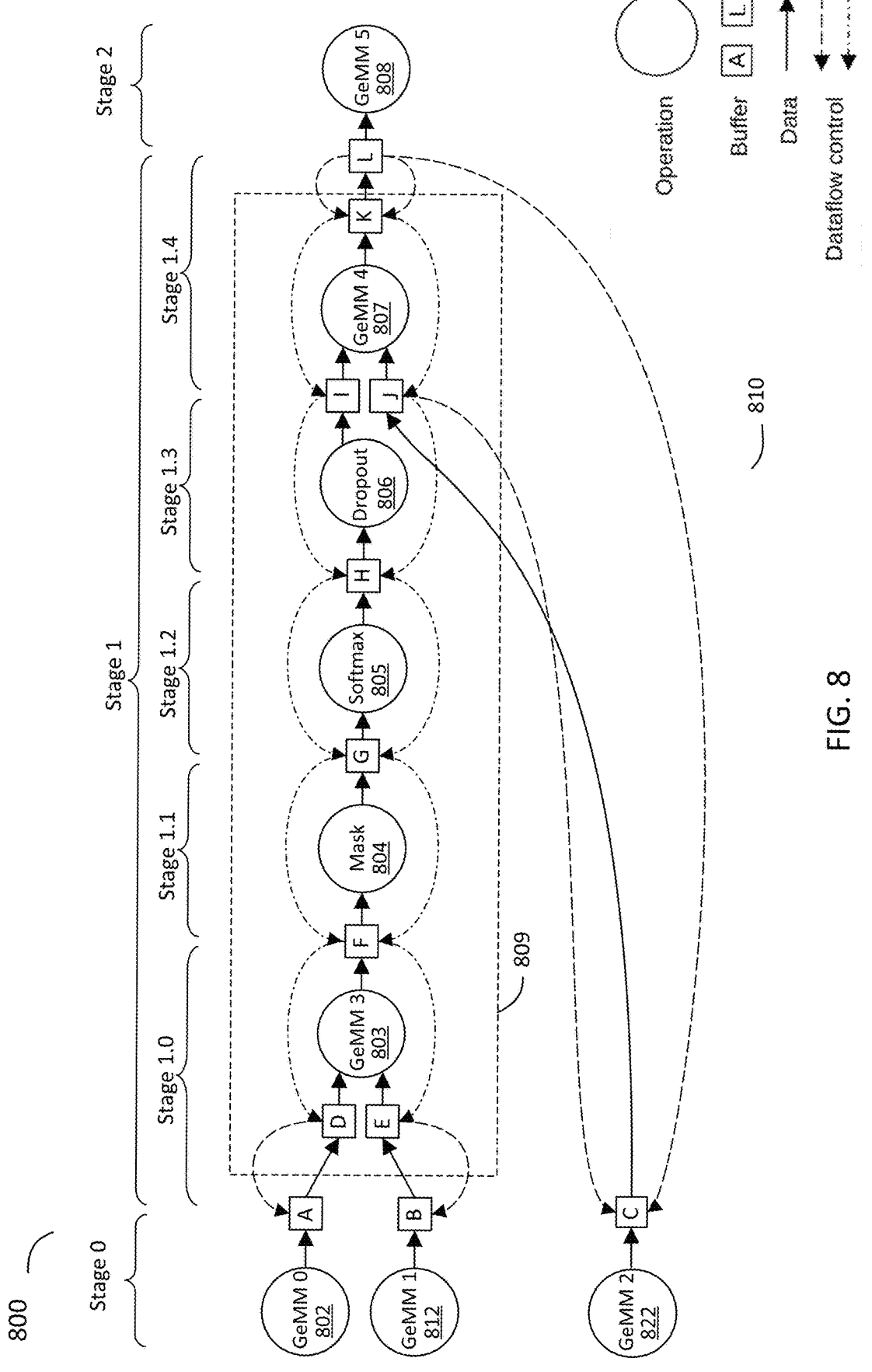
FIG. 8 illustrates the example dataflow graph of FIG. 7 with buffers and dataflow control information added.

FIG. 8 shows the dataflow graph of FIG. 7 with buffers and dataflow control information added. A compiler in the technology presented herein can create graph 800 from dataflow graph 700, assign the nodes to compute units and memory units in a configurable units array, and assign edges and dataflow control information to data channels in an array-level network that connects the compute units and memory units.

To get from dataflow graph 700 to graph 800, one compiler implementation divides the dataflow graph in stages (stages 0, 1, and 2 are shown in this example), and where there are nested loops also in substages (substages 1.0 through 1.4 are shown). The implementation inserts buffers between the stages to allow for pipelined processing in one or more parallel meta-pipelines that may interact. The buffers are shown as blocks labeled A . . . L. They are different from buffers at the gate level, which may be single or double inverters used to boost the energy level of digital signals that need to travel through long wires or that need to drive high-capacitance loads, or which may be flipflops operated by a system clock and used to implement synchronous logic. The buffers at the meta-pipeline level may be memories, register files, shift registers, or first-in-first-out (FIFO) memories of fixed or variable length, storing one or more data items (for example, scalars, vectors, or tensors). They may be clocked by a producer node to store data or by a consumer node to release data. They may further be controlled by dataflow control information coming from, for example, downstream nodes. FIG. 8 shows the same operation nodes as FIG. 7 (with like numbering), but the edges (solid arrows), where dataflows, are interrupted by the buffers to partition the graph into stages, and dataflow control information is added (shown as dashed arrows for loop 810 and dash-dot arrows for loop 809). In the example shown, data travels downstream (solid arrows from the left to the right) and dataflow control information travels upstream (dashed arrows from the right to the left).

In further preparation for a physical implementation of graph 800, an implementation may assign each operation node to one or more logical compute units or memory units, and each buffer to one or more logical memory units. Some implementations may perform further preparations and optimizations. All implementations proceed to place and route, that is, assign the logical units to physical units in a layout of a configurable units array, and (in some implementations) assign the data connections and the dataflow control information connections to data channels in the ALN in the configurable units array.

Figure 9:
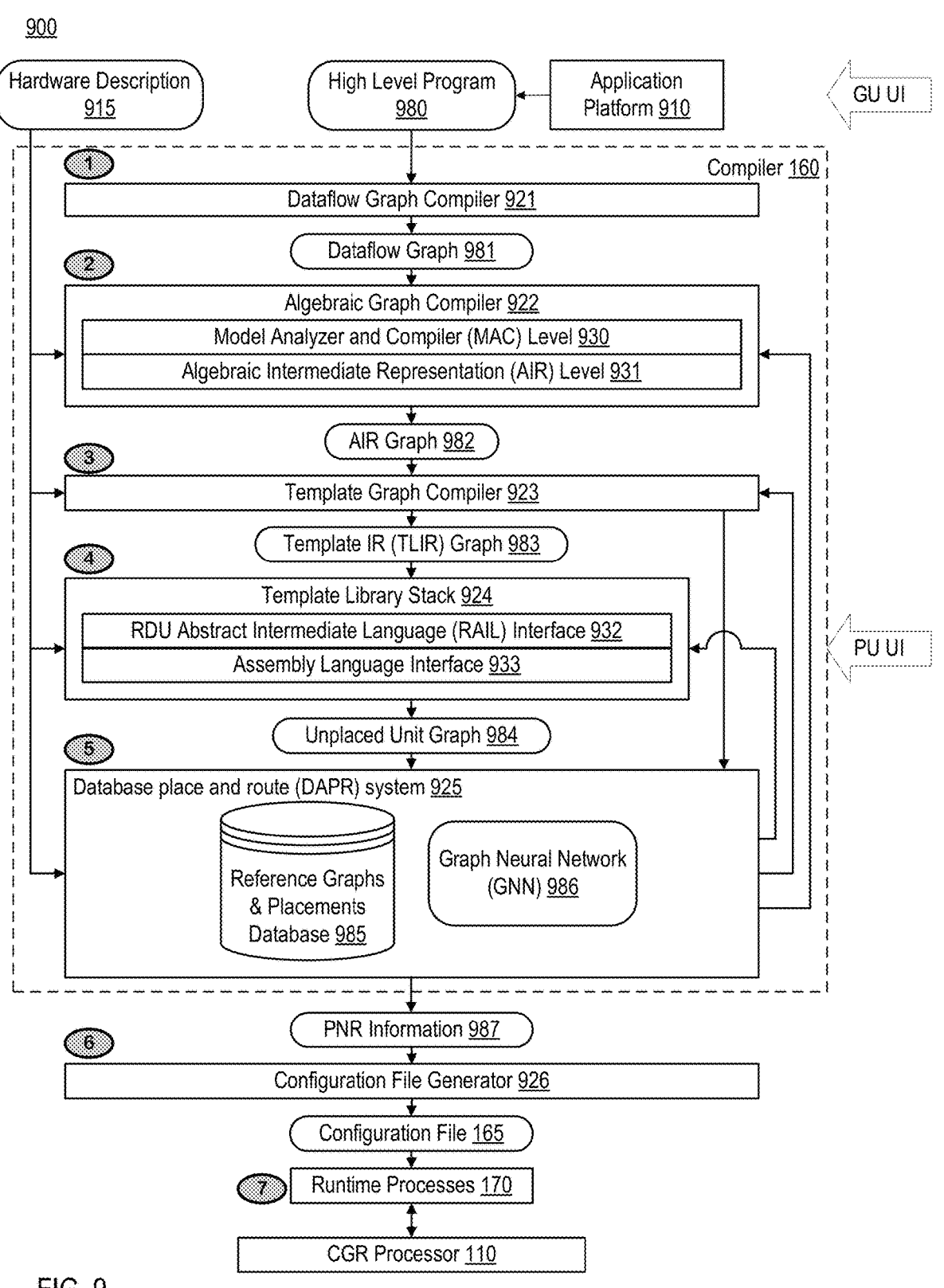
FIG. 9 is a sequence diagram of an example compiler system for transforming a high-level program suitable for mapping onto a configurable units array or a CGR system.

FIG. 9 is a block diagram of an example compiler system flow 900 for transforming a high-level program 980 suitable for mapping onto a configurable units array such as the configurable units array 120, a CGR such as CGR 110, or a CGR system such as CGR system 100. As depicted, the compiler system flow 900 includes several stages to convert a high-level program 980 with user algorithms and functions such as algebraic expressions and functions, to configuration data for the configurable units and the configurable interconnections of CGR processor 110. A compiler 160 may take its input including a high-level program 980 from application platform 910, or any other source of high-level program statements suitable for parallel processing, where application platform 910 may provide a user interface for general users. Compiler 160 may further receive hardware description 915, for example, defining the physical units in a CGR processor such as CGR processor 110 or a CGR system such as CGR system 100. Application platform 910 may include machine learning frameworks such as PyTorch, TensorFlow, ONNX, Caffe, and Keras to provide user-selected and configured algorithms. Application platform 910 provides its output including the high-level program 980 to compiler 160, which in turn provides its output data including placement and routing information 987 to a configuration file generator 926. Configuration file generator 926 provides its output including a configuration file 165 to runtime processes 170, which in turn provides the configuration file 165 to CGR processor 110 or CGR system 100 where it is executed. Compiler 160 may include a dataflow graph compiler 921, an algebraic graph compiler 922, a template graph compiler 923, a template library stack 924, and a database driven place and route (DAPR) 925. Algebraic graph compiler 922 includes a model analyzer and compiler (MAC) level 930 and an arithmetic or algebraic intermediate representation (AIR) level 931. Template library stack 924 includes configurable units array abstract intermediate language (RAIL) 932 and assembly language interfaces 933 for power users.

At action 1, the dataflow graph compiler 921 converts the high-level program 980 with user algorithms and functions from application platform 910 to one or more dataflow graphs 981. The high-level program 980 may be suitable for parallel processing, and therefore parts of the nodes of the dataflow graphs 981 may be intrinsically parallel unless an edge in the graph indicates a dependency. Dataflow graph compiler 921 may provide code optimization steps like false data dependency elimination, dead-code elimination, and constant folding. The dataflow graphs 981 encode the data and dataflow control information of the high-level program 980. Dataflow graph compiler 921 may support programming a CGR processor 110 at multiple levels, for example from an application platform 910 to C++ and assembly language. In some implementations, dataflow graph compiler 921 allows programmers to provide code that runs directly on the configurable data processor. In other implementations, dataflow graph compiler 921 provides libraries that contain predefined functions like linear algebra operations, element-wise tensor operations, activation functions, and reductions required for creating, executing, and profiling the dataflow graphs 981 on the CGR processors 110. Dataflow graph compiler 921 may provide an application programming interface (API) to enhance functionality available using the application platform 910.

At action 2, algebraic graph compiler 922 may include a MAC level that makes high-level mapping decisions for (sub-graphs of the) dataflow graph 981 based on hardware constraints. It may support various application frontends such as Samba, JAX, and TensorFlow/HLO. Algebraic graph compiler 922 may also transform dataflow graphs 981 using autodiff and GradNorm, perform stitching between subgraphs, interface with template generators for performance and latency estimation, convert dataflow graph operations to AIR operation, perform tiling, sharding (database partitioning) and other operations, and model or estimate the parallelism that can be achieved on the dataflow graphs 981.

Algebraic graph compiler 922 may further include AIR level 931 that translates high-level graph and mapping decisions provided by MAC level 930 into explicit AIR/Tensor statements and one or more corresponding algebraic graphs 982. Responsibilities of AIR level 931 may include legalizing the graph and mapping decisions of MAC level 930, expanding data parallel, tiling, metapipe, region instructions provided by MAC level 930, inserting stage buffers and skip buffers, eliminating redundant operations, buffers, and sections, and optimizing for resource use, latency, and throughput. Algebraic graph compiler 922 may legalize the deep neural network (DNN) graphs and task-graphs at AIR level 931, by determining whether operators in the graph are composable, that is, their specific attributes, sizes, and shapes are mappable to a CGR processor, such as CGR processor 110. Algebraic graph compiler 922 may also determine whether the operators are supported by the compiler to CGR processor 110, and whether operators in combination with operators or optimization flags for the compiler are suitable for compilation, among other operator compatibility requirements. Algebraic graph compiler 922 may be carried out by standard compiler passes implemented to check and allow or check and disallow such patterns in the input DNN graphs and task-graphs in process at the compiler level.

At action 3, template graph compiler 923 may translate AIR graphs 982 and/or statements into template library intermediate representation (TLIR) graphs 983 and/or statements, optimizing for the target hardware architecture, into placeable variable-sized units, which may be referred to as logical configurable units, suitable for DAPR system 925. Meta-pipelines that enable iteration control may be allocated for sections of the TLIR statements and/or corresponding sections of the TLIR graphs 983. Template graph compiler 923 may add further information (name, inputs, input names and dataflow description) for DAPR system 925 and make the graph physically realizable through each performed step. Template graph compiler 923 may, for example, provide translation of AIR graphs 982 to specific model operation templates such as for general matrix multiplication (GEMM). An implementation may convert part or all intermediate representation operations to templates, stitch templates into the dataflow and control flow, insert necessary buffers and layout transforms, generate test data and optimize for hardware use, latency, and throughput.

At action 4, template library stack 924 may translate TLIR graphs 983 into unplaced unit graphs 984 including unplaced compute units and memory units, which may correspond to logical, unplaced physically realizable, compute units and memory units. Unplaced unit graphs 984 further includes data connections between the unplaced compute units and memory units.

In some implementations, templates for common operations may be used. Templates may be implemented using assembly language, RAIL, or similar. RAIL is comparable to assembly language in that memory units and compute units are separately programmed, but it can provide a higher level of abstraction and compiler intelligence using a concise performance-oriented domain-specific language for configurable units array templates. Template library stack 924 may include a RAIL low-level interface such as RAIL interface 932 that enables template writers and external power users to control interactions between logical compute units and memory units with high-level expressions without the need to manually program capacity splitting, register allocation, or other types of control interactions. The logical compute units and memory units also enable stage/register allocation, context splitting, transpose slotting, resource virtualization and mapping to multiple physical compute units and memory units, such as, PCUs and PMUs. RAIL also enables event handle allocation.

Template library stack 924 may also include an assembler that provides an architecture-independent low-level programming interface such as assembly language interface 933 as well as optimization and code generation for the target hardware. Responsibilities of the assembler may include address expression compilation, intra-unit resource allocation and management, making a TLIR graph 983 physically realizable with target-specific rules, low-level architecture-specific transformations and optimizations, and architecture-specific code generation.

DAPR system 925 may include a reference graphs and placements database 985 and a graph neural network (GNN) 986. Reference graphs and placements database 985 may include placed reference unit graphs, where each of the placed reference unit graphs has been successfully placed and routed in the configurable units array 120, the corresponding implementation has been successfully executed on the configurable units array 120, and the post-run attributes associated with the execution have met or exceeded a post-run attributes success criterion. As such, each of the placed reference unit graphs have been shown to be a known solution for PNR. Each placed reference unit graph of the placed reference unit graphs may include configurable units, data connections between the configurable units, and placement position attributes of the corresponding configurable units in the configurable units array 120. The configurable units may include memory units and compute units. The data connections between the configurable units may comprise data connections between the memory units and the compute units. The placement position attributes of the corresponding configurable units may include placement position attributes of the corresponding memory units and the compute units in the configurable units array 120. Each placed reference unit graph may further include post-run attributes associated with the execution of an implementation of a corresponding placed and routed reference unit graph.

In some implementations, reference graphs and placements database 985 may comprise a configurable units array attributes table, where each table entry in the configurable units array attributes table may correspond to a placed reference unit graph and the number of table entries in the configurable units array attributes table corresponds to the number of placed reference unit graphs in the reference graphs and placements database 985. The size of each placed reference unit graph is bound by the number of memory units and compute units in a configurable units array. A configurable units array is defined by configurable units array information in the hardware description 915, the configurable units array information may include structural information of a configurable units array such as row and column information, ALN information of the configurable units array, a type of each configurable unit in the configurable units array, position information of each configurable unit, a number of each type of configurable unit for example, the number of memory units and compute units in the configurable units array, and other information associated with the configurable units array.

Each placed reference unit graph of the reference graphs and placements database 985 is a known PNR solution, as previously described. As such, each of the placed reference unit graphs of the reference graphs and placements database 985 may be utilized to train the GNN 986. Training of the GNN is described in more detail with respect to FIGS. 16A and 16B. The DAPR system 986. Once GNN 986 is trained, it may be utilized as a classifier to classify a unit graph, such as unplaced unit graph 984, against reference graphs and placements database 985.

At action 5, DAPR system 925 receives an unplaced unit graph 984 that may represent at least a portion of dataflow graph 981 of high-level program 980. Unplaced unit graph 984 may include unplaced configurable units and data connections between the unplaced configurable units. The unplaced configurable units may include unplaced memory units and compute units, and the data connections between the unplaced configurable units may include data connections between the unplaced memory units and the compute units.

DAPR system 925 may classify unplaced unit graph 984 against a reference graphs and placements database 985 using GNN 986 to identify a nearest matching previously placed reference unit graph of the reference graphs and placements database 985 and an associated matching score. The matching score is found as the ratio of the size of the matching subgraph of the nearest matching previously placed reference unit graph to the size of the nearest matching previously placed reference unit graph. The size of the matching subgraph of the nearest matching previously placed reference unit graph is equal to the number of nodes plus the number of edges in the matching subgraph, and the size of the nearest matching previously placed reference unit graph is equal to the number of nodes plus the number of edges in the nearest matching previously placed reference unit graph. Thus, a similarity matching score for a graph will have a value in the range of 0 and 1 inclusive, where a non-overlapping graph will have a similarity score of 0 and a fully overlapping graph will have a value of 1.

The unplaced unit graph 984 is provided as input to the GNN 986 and the GNN 986 produces the nearest matching previously placed reference unit graph and the associated matching score as output.

DAPR system 925 may determine whether the associated matching score of the nearest matching previously placed reference unit graph is greater than an acceptance threshold. A matching score that is greater than an acceptance threshold indicates that the matching subgraph of the nearest matching previously placed reference unit graph has an appropriate amount of overlap with the unplaced unit graph 984 to utilize the placement information associated with the previously placed matching subgraph to place the corresponding configurable units of the unplaced unit graph 984. A matching score that does not exceed the acceptance threshold indicates that there is not enough overlap to justify using the placement information. An acceptance threshold used to make overlap and placement determinations can be set statically, dynamically, or both statically and dynamically determined. The acceptance threshold value may be set to a static value based on testing and/or experimental results, for example, setting the acceptance threshold value to 0.5 (50% overlap), 0.75 (75% overlap), or another appropriate value between 0 and 1. Alternatively, or in addition to setting the value to a starting static value, the acceptance threshold value may be set dynamically based on the dynamic state of the GNN and newer previously placed reference unit graphs that have been shown to produce improved placement and runtime results and applying that learning in training the GNN to create an improved trained GNN.

In response to a determination that the associated matching score is greater than the acceptance threshold, DAPR system 925 may identify a matching subgraph of the nearest matching previously placed reference unit graph. DAPR system 925 may also assign the placement position attributes of configurable units of the matching subgraph of the nearest matching previously placed reference unit graph to corresponding placement positions of configurable units of the unplaced unit graph 984 in a configurable units array 120. The assignment of the placement position attributes may include the assignment of the placement position attributes of memory units and compute units of the matching subgraph of the nearest matching previously placed reference unit graph to corresponding placement positions of memory units and compute units of the unplaced unit graph 984 in the configurable units array 120. DAPR system 925 may further place unmatched configurable units of the unplaced unit graph 984 onto positions in the configurable units array 120. The placement of the unmatched configurable units may include the placement of unmatched memory units and unmatched compute units of the unplaced unit graph 984 onto positions in the configurable units array 120. In response to determining that the associated matching score is less than or equal to the acceptance threshold, DAPR system 925 may place, using an ab-initio placer, the unplaced memory units and the unplaced compute units of the unplaced unit graph 984 onto positions in the configurable units array 120 of CGR processor 110 at the physical chip level.

DAPR system 925 may route data and dataflow control information between the placement positions in the configurable units array 120. As part of the routing, DAPR system 925 may determine physical data channels to allow for communication among the configurable units and between the configurable units and circuits coupled using the TLN. DAPR system 925 may allocate ports on the configurable units and switches and provide configuration data and initialization data for the target hardware including the configurable units array 120 and CGR processor 110.

DAPR system 925 may further provide bandwidth calculations, allocate network interfaces such as AGCUs and virtual address generators (VAGs), provide configuration data that allows AGCUs and/or VAGs to perform address translation, and control ALN switches and data routing. DAPR system 925 may provide its functionality in multiple steps and may include multiple modules (not shown in FIG. 9) to provide the multiple steps including a placer, a port allocator, and a router. DAPR system 925 may receive its input data in various ways. For example, it may receive parts of its input data from any of the earlier modules (dataflow graph compiler 921, algebraic graph compiler 922, template graph compiler 923, and/or template library 924). In some implementations, an earlier module, such as template graph compiler 923, may have the task of preparing all information for DAPR system 925 and no other units provide PNR input data directly. DAPR system 925 may produce PNR information 987.

At action 6, a configuration file generator 926 may receive PNR information 987 from DAPR system 925 and generate a configuration file 165 with configuration data for the placement positions of the configurable units of the unplaced unit graph 984 and the routed data and the dataflow control information. The configuration data, when loaded onto an instance of the configurable units array 120, causes the configurable units array 120 to implement at least the portion of the dataflow graph 981 represented by the unplaced unit graph 984. Configuration file 165 may be a processor-executable format (PEF) file. In one implementation, this includes assigning coordinates and communication resources of the physical memory and compute units by placing and routing units onto the configurable units array 120 while maximizing bandwidth and minimizing latency.

At action 7, the runtime processes 170 loads the configuration file 165 onto an instance of the configurable units array 120 of CGR processor 110 and causes the configurable units array 120 of CGR processor 110 to execute the configuration file 165 to implement at least the portion of the dataflow graph 981 represented by the unplaced unit graph 984.

Further implementations of compiler 160 provide for an iterative process, for example by feeding information from DAPR system 925 back to an earlier module, so that the earlier module can execute a new compilation step in which it uses physically realized results rather than estimates of or placeholders for physically realizable circuits. For example, DAPR system 925 may feed information regarding the physically realized circuits back to algebraic graph compiler 922.

Memory allocations represent the creation of logical memory spaces in on-chip and/or off-chip memories for data required to implement the dataflow graph 981, and these memory allocations are specified in the configuration file. Memory allocations define the type and the number of hardware circuits (functional units, storage, or connectivity components). Main memory (for example, DRAM) may be off-chip memory, and scratchpad memory (for instance, SRAM) is on-chip memory inside a configurable units array. Other memory types for which the memory allocations can be made for various access patterns and layouts include cache, read-only Look-Up Tables (LUTs), serial memories (such as, FIFOs), and register files.

Compiler 160 binds memory allocations to unplaced memory units and binds operations specified by operation nodes in the dataflow graph to unplaced compute units, and these bindings may be specified in the configuration data. In some implementations, compiler 160 partitions parts of a dataflow graph into memory subgraphs and compute subgraphs and specifies these subgraphs in the PEF file. A memory subgraph may comprise address calculations leading up to a memory access. A compute subgraph may comprise all other operations in the parent graph. In one implementation, a parent graph is broken up into multiple memory subgraphs and exactly one compute subgraph. In one implementation, the compiler performs the partitioning using reverse dataflow analysis such that inputs to an address used in a memory access recursively flag until compiler 160 reaches either constant values or (bound) loop/pattern iterators. A single parent graph can produce one or more memory subgraphs, depending on how many memory accesses exist in the original loop body. In cases where the same memory addressing logic is shared across multiple memory accesses, address calculation may be duplicated to create multiple memory subgraphs from the same parent graph.

Compiler 160 generates the configuration files with configuration data, such as a bit stream, for the placement positions and the routed data and dataflow control information. In one implementation, this includes assigning coordinates and communication resources of the physical configurable units by placing and routing unplaced units onto the configurable units array while maximizing bandwidth and minimizing latency.

A first example of accelerated deep learning is using a deep learning accelerator implemented in a CGRA to train a neural network. A second example of accelerated deep learning is using the deep learning accelerator to operate a trained neural network to perform inferences. A third example of accelerated deep learning is using the deep learning accelerator to train a neural network and subsequently perform inference with any one or more of the trained neural networks, information from the trained neural network, and a variant of the same.

Examples of neural networks include fully connected neural networks (FCNNs), recurrent neural networks (RNNs), graph neural networks (GNNs), convolutional neural networks (CNNs), graph convolutional networks (GCNs), long short-term memory (LSTM) networks, auto-encoders, deep belief networks, and generative adversarial networks (GANs).

An example of training a neural network is determining one or more weights associated with the neural network, such as by back-propagation in a deep learning accelerator. An example of making an inference is using a trained neural network to compute results by processing input data using the weights associated with the trained neural network. As used herein, the term 'weight' is an example of a 'parameter' as used in various forms of neural network processing. For example, some neural network learning is directed to determining parameters (such as, through back-propagation) that are usable for performing neural network inferences.

A neural network processes data according to a dataflow graph comprising layers of neurons. Example layers of neurons include input layers, hidden layers, and output layers. Stimuli (such as, input data) are received by an input layer of neurons and the computed results of the dataflow graph (for example, output data) are provided by an output layer of neurons. Example hidden layers include rectified linear unit (ReLU) layers, fully connected layers, recurrent layers, graphical network layers, long short-term memory layers, convolutional layers, kernel layers, dropout layers, and pooling layers. A neural network may be conditionally and/or selectively trained. After being trained, a neural network may be conditionally and/or selectively used for inference.

Examples of ICs, or parts of ICs, which may be used as deep learning accelerators, are processors such as central processing unit (CPUs), CGR processor ICs, graphics processing units (GPUs), FPGAs, ASICs, application-specific instruction-set processor (ASIP), and digital signal processors (DSPs). The disclosed technology implements efficient distributed computing by allowing an array of accelerators (for example, reconfigurable processors) attached to separate hosts to directly communicate with each other using buffers.

FIG. 10 is a block diagram of an example DAPR system flow 1000 for placement and routing of a unit graph such as unplaced unit graph 984 onto a configurable units array such as the configurable units array 120, a CGR processor such as CGR processor 110, or a CGR system such as CGR system 100. DAPR system 925 of compiler 160 may include a GNN classifier 1040, a matching subgraph identifier 1041, placement positions assigner 1046, free unit placer 1047, router 1048, and PNR graph updater 1049. GNN classifier 1040 may include GNN 986. The matching subgraph identifier 1041 may include a topological sorter 1042, a TP sequence aligner 1043, a minimum spanning tree (MST) builder 1044, and an MST sequence aligner 1045.

At action 1, GNN classifier 1040 may classify unplaced unit graph 984 against the reference graphs and placements database 985 using GNN 986 to identify a nearest matching previously placed reference unit graph 1060 of the reference graphs and placements database 985 and an associated matching score.

At action 2, the matching subgraph identifier 1041 may identify a matching subgraph 1061 of the nearest matching previously placed reference unit graph 1060.

At action 3, the matching subgraph identifier 1041 may determine whether the nearest matching previously placed reference unit graph 1060 is a directed acyclic graph.

At action 4, in response to the determination that the nearest matching previously placed reference unit graph 1060 is a directed acyclic graph, the topological sorter 1042 may perform a topological sort of the nearest matching previously placed reference unit graph 1060 to linearize the nearest matching previously placed reference unit graph 1060, produce an associated topological sort nearness metric, and create a topological sort sequence of the nearest matching previously placed reference unit graph 1060. Similarly, the topological sorter 1042 may perform a topological sort of the unplaced unit graph 984 to linearize the unplaced unit graph 984, produce an associated topological sort nearness metric, and to create a topological sort sequence of the unplaced unit graph 984. The topological sorter 1042 may compare the two topological sort sequences.

At action 5, the TP sequence aligner 1043 may align the two topological sort sequences to find common branches, identify the matching subgraph 1061 of the nearest matching previously placed reference unit graph 1060, a matching score, and the remaining unmatched units of the unplaced unit graph 984, and extract placements of the corresponding configurable units of the matching subgraph 1061 of the nearest matching previously placed reference unit graph 1060. The TP sequence aligner 1043 may utilize the topological-sort nearness metric and an edit distance, such as Levenshtein distance, to find and identify the matching subgraph 1061 of the nearest matching previously placed reference unit graph 1060.

At action 6, in response to the determination that the nearest matching previously placed reference unit graph 1060 is a directed cyclic graph (is not a directed acyclic graph), MST builder 1044 may compute an MST of the nearest matching previously placed reference unit graph 1060 and compute an MST of the unplaced unit graph 984. The MST builder 1044 may utilize Prim's algorithm to compute the MSTs and their associated MST sequences of the nearest matching previously placed reference unit graph 1060 and the unplaced unit graph 984. The MST description of the nearest matching previously placed reference unit graph 1060 is utilized to reduce the cycle. A depth first search (DFS) of the MST of the nearest matching previously placed reference unit graph 1060 linearizes the MST of the nearest matching previously placed reference unit graph 1060 and creates its associated MST sequence. Similarly, a DFS of the MST of the unplaced unit graph 984 linearizes it and creates its associated sequence.

At action 7, the MST sequence aligner 1045 may align the two associated MST sequences to find common branches, identify the matching subgraph 1061 of the nearest matching previously placed reference unit graph 1060, and extract placements of the corresponding configurable units of the matching subgraph 1061 of the nearest matching previously placed reference unit graph 1060.

At action 8, placement positions assigner 1046 may assign the placement position attributes of configurable units of the matching subgraph 1061 of the nearest matching previously placed reference unit graph 1060 to corresponding placement positions of configurable units of the unplaced unit graph 984 in a configurable units array 120 to create an assigned positions unit graph 1062. The assignment of the placement position attributes may include the assignment of the placement position attributes of memory units and compute units of the matching subgraph 1061 of the nearest matching previously placed reference unit graph 1060 to corresponding placement positions of memory units and compute units of the assigned positions unit graph 1062 in the configurable units array 120.

At action 9, free unit placer 1047 may place the unmatched (remaining unplaced) configurable units of the assigned positions unit graph 1062 including the unplaced memory units and the unplaced compute units of the assigned positions unit graph 1062 onto positions in the configurable units array 120 of CGR processor 110. This process uses the placement position attributes assigned to the memory units and the compute units of the matching subgraph 1061, a legalizer and free unit placer 1047 based on simulated annealing for the remaining unplaced units, and updated constraints to achieve the finalized placement of placed unit graph 1063.

At action 10, router 1048 may route data and dataflow control information between the placement positions in the configurable units array 120 of placed unit graph 1063 to create a PNR unit graph 1064. Placement positions assigner 1046, free unit placer 1047, and router 1048 may each generate portions of the PNR information 987.

At action 11, configuration file generator 926 may receive PNR information 987 from DAPR SYSTEM 925 and generate a configuration file 165 with configuration data for the placement positions and the routed data and dataflow control information for the PNR unit graph 1064.

At action 12, the runtime processes 170 loads the configuration file 165 onto an instance of the configurable units array 120 and causes the configurable units array 120 of CGR processor 110 to execute the configuration file 165 to implement at least the portion of the dataflow graph 981 represented by the PNR unit graph 1064.

After the configurable units array 120 completes the execution of the PNR unit graph 1064, runtime processes 170 may retrieve post-run attributes 1065 associated with the execution of the PNR unit graph 1064 from CGR processor 110.

At action 13, the PNR graph updater 1049 may add the PNR unit graph 1064 and the post-run attributes 1065 associated with the execution of the configuration file 165 to a new entry in the reference graphs and placements database 985. The PNR graph updater 1049 addition may be based on the post-run attributes 1065 and a post-run attributes success criterion, where the addition is made when the post-run attributes 1065 have met or exceeded the post-run attributes success criterion. The post-run attributes may include utilization, throughput, and latency numbers associated with the execution of the configuration file 165. The post-run attributes success criterion may be met or exceeded when the utilization of the execution has met or exceeded a utilization threshold, the throughput of the execution has met or exceeded a throughput threshold, the latency numbers associated with the execution have met or exceeded latency numbers thresholds, or combinations of any of these.

FIG. 11 is a flowchart illustrating an example of a computer-implemented method 1100 for database driven place and route for coarse-grain reconfigurable architecture (CGRA) systems. For clarity of presentation, the description that follows generally describes method 1100 in the context of the other figures in this description. However, it will be understood that method 1100 can be performed, for example, by any system, environment, software, and hardware, or a combination of systems, environments, software, and hardware, as appropriate. In some implementations, various steps of method 1100 can be run in parallel, in combination, in loops, or in any order.

At 1102, an unplaced unit graph representing at least a portion of a dataflow graph of a high-level program is received, by a database driven place and route (DAPR) system. The unplaced unit graph includes configurable units and data connections between the configurable units. The configurable units may include memory units and compute units, and the data connections may be between the memory units and the compute units. From 1102, method 1100 proceeds to 1104.

At 1104, the unplaced unit graph is classified against a database of previously placed reference unit graphs using a graph neural network (GNN) to identify a nearest matching previously placed reference unit graph of the database. From 1104, method 1100 proceeds to 1106.

At 1106, Configurable units of the unplaced unit graph are placed onto positions in a configurable units array based on placement position attributes of at least a portion of configurable units of the nearest matching previously placed reference unit graph. From 1106, method 1100 proceeds to 1108.

At 1108, data and dataflow control information are routed between the configurable units of the unplaced unit graph placed onto positions in the configurable units array. From 1108, method 1100 proceeds to 1110.

At 1110, Configuration data is generated that enables the configurable units array to execute at least a portion of the unplaced unit graph. After 1110, method 1100 stops.

Figure 12B:
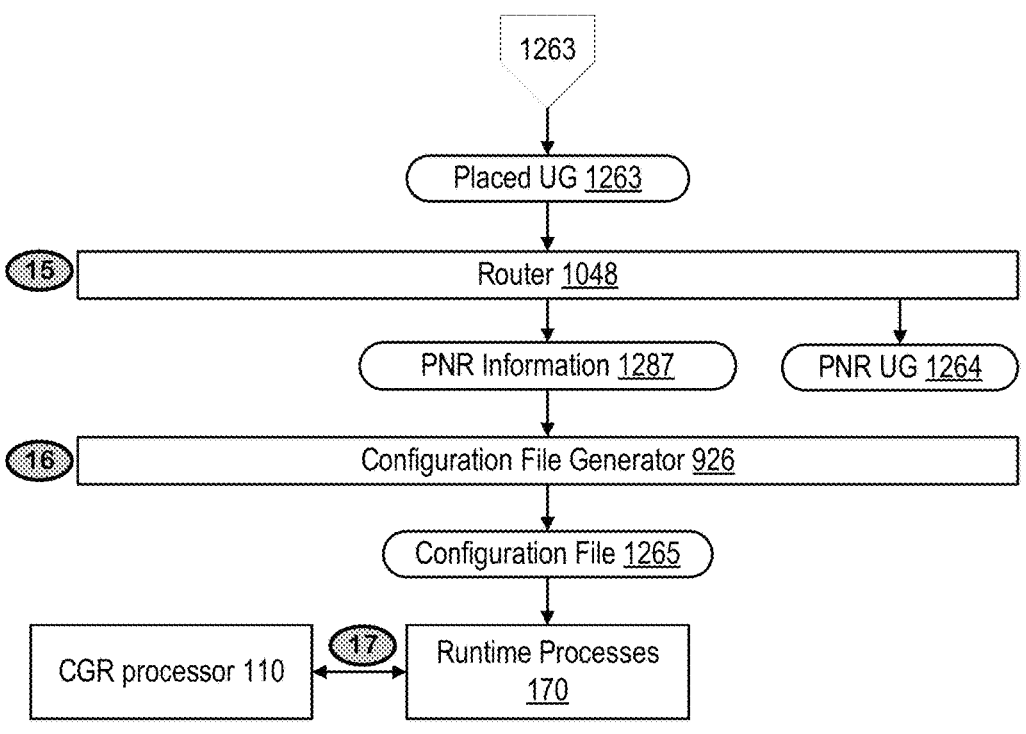

FIGS. 12A and 12B illustrate a sequence diagram of an example database driven place and route system 1200 including an iterative database driven place and route system 1225 for placement and routing of a unit graph such as unplaced unit graph 984 onto a configurable units array such as the configurable units array 120, a CGR processor such as CGR processor 110, or a CGR system such as CGR system 100. As shown, iterative DAPR system 1225 may include a priority list updater 1240, a priority list selector 1241, a GNN classifier 1242, a remaining unplaced subgraph list updater 1243, a matching subgraph identifier 1244, a placement positions assigner 1245, a placed matching subgraphs List updater 1246, a topologically orderer 1247, a layout identifier 1248, a remaining configuration units identifier 1249, a free unit placer 1250, router 1048, configuration file generator 926, runtime processes 170, and CGR processor 110.

At action 1, priority list updater 1240 may add an unplaced unit graph 984 to priority list of unplaced graphs 1260. The priority list of unplaced graphs 1260 may be maintained in a priority order. The unplaced unit graph 984 may represent at least a portion of a dataflow graph of a high-level program. In some embodiments, the priority list may be a max-heap and the priority order may be ordered by the size of each unplaced unit graph in the priority list. The size of each unplaced unit graph may be equal to the number of nodes plus the number of edges of the corresponding unplaced unit graph.

At action 2, iterative DAPR system 1225 may determine whether the priority list of unplaced graphs 1260 is not empty. As part of determining whether the priority list 1260 is not empty, iterative DAPR system 1225 may first determine whether the iteratively selecting, classifying, and determining a particular unplaced graph at the top of the max-heap may be stuck in a loop where no progress is being made. To avoid being stuck in a loop, the number of unsuccessful retries is tracked. When the number of retries exceeds a retry threshold, iterative DAPR system 1225 may remove each unplaced unit graph from the priority list 1260 and add them to the remaining unplaced subgraphs list 1268, which results in the priority list 1260 being empty. Then iterative DAPR system 1225 may determine whether the priority list of unplaced graphs 1260 is not empty.

In response to the determination that the priority list of unplaced graphs 1260 is not empty, iterative DAPR system 1225 may perform priority list processing including actions 3 through 10.

At action 3, priority list selector 1241 may select a current graph 1261 from the priority list 1260. The selection may be based on a priority of each graph in the priority list of unplaced graphs 1260. Selecting the current graph 1261 from the priority list 1260 may also include removing the current graph 1261 from the priority list 1260.

Iterative DAPR system 1225 may perform iterative DAPR classification of the current graph 1261 against reference graphs and placements database 985 using GNN 986 to retrieve a placed matching subgraph of the current graph 1265 and an unplaced subgraph of the current graph 1266 based on a nearest matching previously placed reference unit graph 1262 of the reference graphs and placements database 985 and an associated matching score 1263. Performing iterative DAPR classification of the current graph 1261 includes actions 4 through 7.

At action 4, GNN classifier 1242 may classify the current graph 1261 against reference graphs and placements database 985 using GNN 986 to identify the nearest matching previously placed reference unit graph 1262 of reference graphs and placements database 985 and the associated matching score 1263.

Iterative DAPR system 1225 performing iterative DAPR classification of the current graph 1261 may also include iterative DAPR system 1225 retrieving the placed matching subgraph of the current graph 1265 and the unplaced subgraph of the current graph 1266 based on the nearest matching previously placed reference unit graph 1262 of reference graphs and placements database 985 and the associated matching score 1263, which further includes actions 5 through action 7.

At action 5, iterative DAPR system 1225 may determine whether the matching score 1263 associated with the nearest matching previously placed reference unit graph 1262 is greater than an acceptance threshold.

At action 6, in response to determining that the associated matching score 1263 is greater than the acceptance threshold, matching subgraph identifier 1244 may identify a placed matching subgraph 1264 of the nearest matching previously placed reference unit graph 1262.

At action 7, placement positions assigner 1245 may assign the placement position attributes of configurable units of the placed matching subgraph 1264 of the nearest matching previously placed reference unit graph 1262 to placement position attributes of configurable units of a corresponding placed matching subgraph of the current graph 1261 to create the placed matching subgraph of the current graph 1265. The assignment of the placement position attributes may include the assignment of the placement position attributes of memory units and compute units of the placed matching subgraph 1264 of the nearest matching previously placed reference unit graph 1262 to corresponding placement positions of memory units and compute units of placed matching subgraph of the current graph 1265. The remaining unplaced configurable units of the current graph 1261 comprise the unplaced subgraph of the current graph 1266.

Iterative DAPR system 1225 performing iterative DAPR classification of the current graph 1261 may further include iterative DAPR system 1225 processing the placed matching subgraph of the current graph 1265 and the unplaced subgraph of the current graph 1266 to update at least one of the priority list 1260, a placed matching subgraphs list 1267, and a remaining unplaced subgraphs list 1268 based on the associated matching score 1263, which also includes actions 8 through 10.

Iterative DAPR system 1225 may determine whether the associated matching score 1263 is greater than an acceptance threshold. In response to determining that the associated matching score 1263 is greater than the acceptance threshold, actions 8 and 9 are performed. The associated matching score 1263 being greater than the acceptance threshold indicates that the placed matching subgraph of the current graph 1265 has been placed.

At action 8, placed matching subgraphs list updater 1246 may add the placed matching subgraph of the current graph 1265 to the placed matching subgraphs list 1267.

At action 9, priority list updater 1240 may add the unplaced subgraph of the current graph 1266 to the priority list 1260.

In response to determining that the associated matching score 1263 is less than or equal to the acceptance threshold, action 10 is performed. The associated matching score 1263 being less than or equal to the acceptance threshold indicates that the placed matching subgraph of the current graph 1265 has not been placed.

At action 10, remaining unplaced subgraphs list updater 1243 may add the unplaced subgraph of the current graph 1266 to the remaining unplaced subgraphs list 1268.

Iterative DAPR system 1225 may determine whether the priority list 1260 of unplaced graphs 1260 is empty. In response to the determination that the priority list 1260 of unplaced graphs 1260 is not empty, iterative DAPR system 1225 may perform another iteration of priority list processing.

In response to the determination that the priority list of unplaced graphs 1260 is empty, iterative DAPR system 1225 may perform iterative DAPR placement to place configurable units of each placed matching subgraph in the placed matching subgraphs list 1267 and configurable units of each unplaced subgraph in the remaining unplaced subgraphs list 1268 based on corresponding placement position attributes of configurable units of each placed matching subgraph in the placed matching subgraphs list 1267. Performing iterative DAPR placement includes performing actions 11 through 14.

At action 11, topological orderer 1247 may order the placed matching subgraphs in the placed matching subgraphs list 1267 topologically using a topological sort algorithm.

At action 12, layout identifier 1248 may identify a placement layout of the ordered placed matching subgraphs in the placed matching subgraphs list 1267 based on left-to-right and top-to-bottom bounding boxes to create a composite graph 1269 with the configurable units of the composite graph 1269 placed onto positions in the configurable units array 120 based on the corresponding placement position attributes of the configurable units of each placed matching subgraph in the placed matching subgraphs list 1267. Layout identifier 1248 may also generate position constraints associated with the composite graph 1269 set by the placement positions of the configurable units of the composite graph 1269 in the configurable units array 120.

At action 13, remaining configuration units identifier 1249 may identify remaining configurable units 1270 to be placed from the union of the configurable units of each unplaced subgraph in the remaining unplaced subgraphs list 1268.

At action 14, free unit placer 1250 may place the remaining configurable units 1270 to be placed onto positions in the configurable units array 120 within the position constraints associated with the composite graph 1269 set by the placement positions of the configurable units of the composite graph 1269 in the configurable units array 120. Free unit placer 1250 may also create a placed unit graph 1263. The free unit placer 1250 may comprise a simulated annealing placer.

At action 15, router 1048 may route data and dataflow control information between the placement positions in configurable units array 120 of placed unit graph 1263 to create a PNR unit graph 1264. Placement positions assigner 1245, free unit placer 1250, and router 1048 may each generate portions of the PNR information 1287. The PNR information 1287 may be based on at least the placement positions of the configurable units of the composite graph 1269 in the configurable units array 120, the placement positions of the remaining configurable units 1270 in the configurable units array 120, the routed data and dataflow control information between the placement positions in configurable units array 120 of placed unit graph 1263.

At action 16, configuration file generator 926 may receive PNR information 1287 from iterative DAPR system 1225 and generate a configuration file 1265 with configuration data for the placement positions and the routed data and dataflow control information for the PNR unit graph 1264. The configuration data, when loaded onto an instance of a configurable units array 120, may cause the configurable units array 120 to implement at least the portion of the dataflow graph 981 represented by the unplaced unit graph 984.

At action 17, the runtime processes 170 loads the configuration file 1265 onto an instance of configurable units array 120 and causes configurable units array 120 of CGR processor 110 to execute the configuration file 1265 to implement at least the portion of the dataflow graph 981 represented by the PNR unit graph 1264.

FIG. 13 is a flowchart illustrating an example of a computer-implemented method 1300 for iterative database driven place and route for coarse-grain reconfigurable architecture (CGRA) systems. For clarity of presentation, the description that follows generally describes method 1300 in the context of the other figures in this description. However, it will be understood that method 1300 can be performed, for example, by any system, environment, software, and hardware, or a combination of systems, environments, software, and hardware, as appropriate. In some implementations, various steps of method 1300 can be run in parallel, in combination, in loops, or in any order.

At 1302, an unplaced unit graph is added, by a database driven place and route (DAPR) system, to a priority list, the unplaced unit graph representing at least a portion of a dataflow graph of a high-level program. From 1302, method 1300 proceeds to 1304.

At 1304, a current subgraph of the unplaced unit graph is selected from the priority list. From 1304, method 1300 proceeds to 1306.

At 1306, the current subgraph of the unplaced unit graph is classified against a database of previously placed reference unit graphs using a graph neural network (GNN) to identify a nearest matching previously placed reference unit graph of the database. From 1306, method 1300 proceeds to 1308.

At 1308, a placed matching subgraph of the current subgraph of the unplaced unit graph is determined from a placed matching subgraph of the nearest matching previously placed reference unit graph. From 1308, method 1300 proceeds to 1310.

At 1310, selecting, classifying, and determining is iterated, until the priority list is empty. From 1310, method 1300 proceeds to 1312.

At 1312, a placement layout of configurable units of each placed matching subgraph of the unplaced unit graph onto a configurable units array is identified. From 1312, method 1300 proceeds to 1314.

At 1314, data and dataflow control information is routed between the configurable units of each placed matching subgraph of the unplaced unit graph placed onto positions in the configurable units array. From 1314, method 1300 proceeds to 1316.

At 1316, configuration data is generated that enables the configurable units array to execute at least a portion of the unplaced unit graph. After 1316, method 1300 stops.

Figure 14:
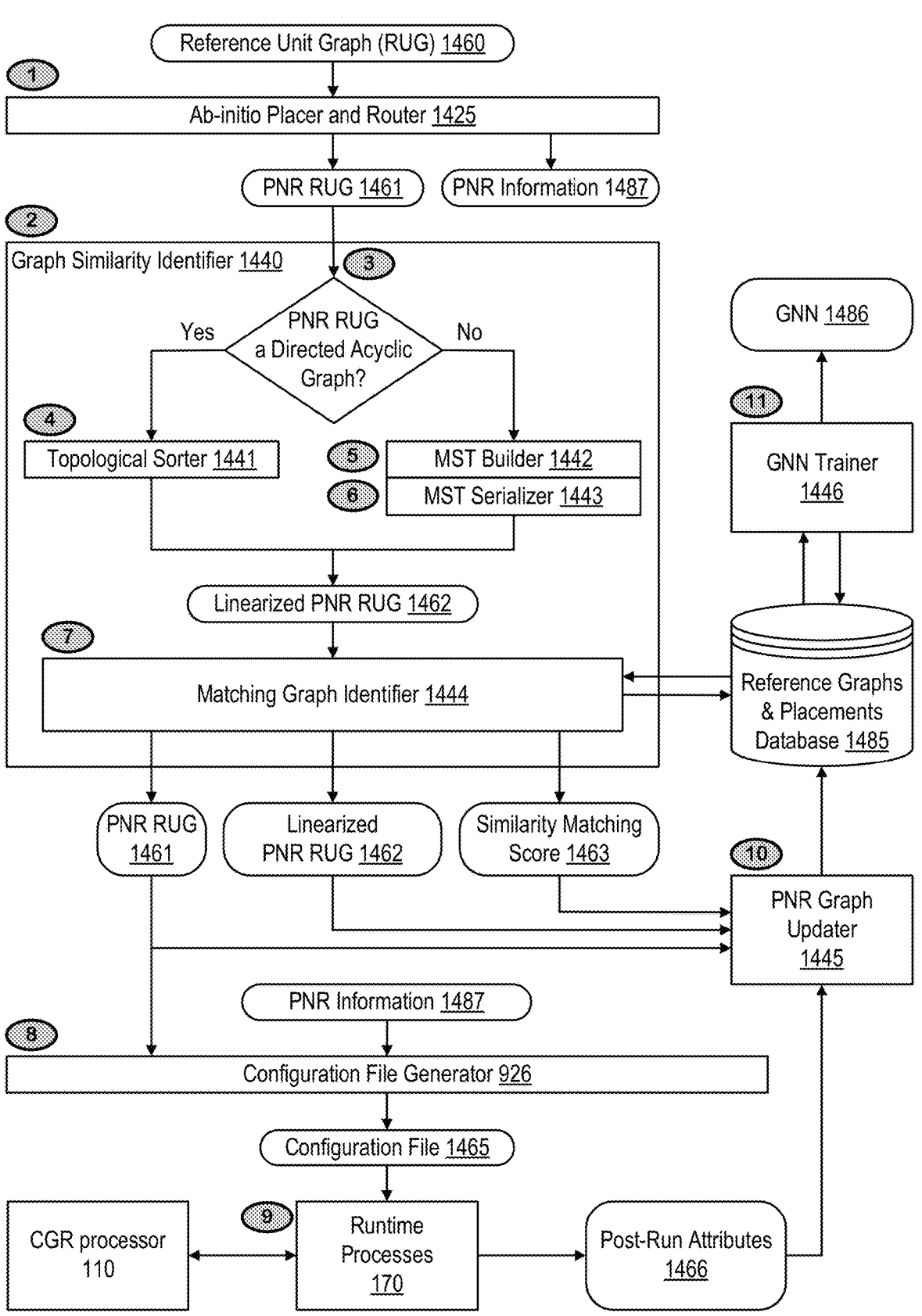
FIG. 14 is a sequence diagram of an example database construction flow for constructing a database of known reference graphs and their placement onto a configurable units array.

FIG. 14 is a sequence diagram of an example database construction flow 1400 for constructing a reference graphs and placements database 1485 of known PNR solutions. As shown, the database construction flow 1400 includes an ab-initio PNR 1425, a graph similarity identifier 1440, a PNR graph updater 1445, and a GNN trainer 1446. The graph similarity identifier 1440 includes a topological sorter 1441, an MST builder 1442, an MST serializer 1443, and a matching graph identifier 1444.

At action 1, the ab-initio PNR 1425 may perform an architecture agnostic PNR algorithm on a reference unit graph 1460 to create a PNR reference unit graph 1461 and PNR information 1487. The PNR reference unit graph 1461 includes configurable units, data and dataflow control information between the configurable units in a configurable units array such as the configurable units array 120, and placement position attributes of the corresponding configurable units. The configurable units of the PNR reference unit graph 1461 may include memory units and compute units. The data and dataflow control information may include data and dataflow control information between the memory units and the compute units. The placement position attributes of the corresponding configurable units may include placement position attributes of the memory units and the compute units in the configurable units array 120. The placement position attributes may include the placement positions of the corresponding memory units and the compute units in the configurable units array 120.

At action 2, the graph similarity identifier 1440 may linearize the PNR reference unit graph 1461 to create a linearized PNR reference unit graph 1462 and a similarity matching score 1463.

At action 3, the graph similarity identifier 1440 may determine whether the PNR reference unit graph 1461 is a directed acyclic graph.

At action 4, in response to the determination that the PNR reference unit graph 1461 is a directed acyclic graph, the topological sorter 1441 may perform a topological sort of the PNR reference unit graph 1461 to linearize the PNR reference unit graph 1461 and create the linearized PNR reference unit graph 1462.

At action 5, in response to the determination that the PNR reference unit graph 1461 is a directed cyclic graph (is not a directed acyclic graph), MST builder 1442 may compute an MST of the PNR reference unit graph 1461. The MST builder 1442 may utilize Prim's algorithm to compute the MST of the PNR reference unit graph 1461. The MST description of the PNR reference unit graph 1461 is utilized to reduce the cycle.

At action 6, the MST serializer 1443 may perform a depth first search (DFS) of the MST of the PNR reference unit graph 1461 to linearize the MST of the PNR reference unit graph 1461 and create the linearized PNR reference unit graph 1462.

At action 7, matching graph identifier 1444 may determine a similarity matching score 1463 for the linearized PNR reference unit graph 1462.

The matching graph identifier 1444 may compare the linearized PNR reference unit graph 1462 against each linearized previously placed reference unit graph in the reference graphs and placements database 1485 to identify a nearest matching previously placed reference unit graph in the reference graphs and placements database 1485 having a higher similarity matching score than each corresponding similarity matching score of each of the other linearized previously placed reference unit graphs in the reference graphs and placements database 1485. Each similarity matching score is found as the ratio of the size of the largest matching subgraph of each corresponding linearized previously placed reference unit graph in the reference graphs and placements database 1485 to the size of each corresponding linearized previously placed reference unit graph. The size of the largest matching subgraph of a corresponding linearized previously placed reference unit graph is equal to the number of nodes plus the number of edges in the largest matching subgraph, and the size of the corresponding linearized previously placed reference unit graph is equal to the number of nodes plus the number of edges in the corresponding linearized previously placed reference unit graph. Thus, a similarity matching score for a graph will have a value in the range of 0 and 1 inclusive, where a non-overlapping graph will have a similarity score of 0 and a fully overlapping graph will have a value of 1.

At action 8, configuration file generator 926 may receive PNR information 1487 from ab-initio PNR 1425 and generate a configuration file 1465 with configuration data for the placement positions and the routed data and dataflow control information for the PNR reference unit graph 1461.

At action 9, the runtime processes 170 may load the configuration file 1465 onto an instance of the configurable units array 120 of CGR processor 110 and causes the configurable units array 120 of CGR processor 110 to execute the configuration file 1465 to implement the PNR reference unit graph 1461. After the configurable units array 120 of CGR processor 110 completes the execution of the configuration file 1465, runtime processes 170 may retrieve post-run attributes 1466 associated with the execution from the configurable units array 120 of CGR processor 110.

At action 10, the PNR graph updater 1445 may add the PNR reference unit graph 1461 including the placement position attributes of the corresponding configurable units in the configurable units array 120, the linearized PNR reference unit graph 1462, the similarity matching score 1463, and the post-run attributes 1466 associated with the execution of the configuration file 1465 to a new entry in the reference graphs and placements database 1485. The placement position attributes may include the placement positions (also referred herein as placed coordinates) of the corresponding memory units and the compute units in the configurable units array 120. The PNR graph updater 1445 addition may be based on the post-run attributes 1466 and a post-run attributes success criterion, where the addition is made when the post-run attributes 1465 have met or exceeded the post-run attributes success criterion. The post-run attributes may include utilization, throughput, and latency numbers associated with the execution of the configuration file 1465. The post-run attributes success criterion may be met or exceeded when the utilization of the execution has met or exceeded a utilization threshold, the throughput of the execution has met or exceeded a throughput threshold, the latency numbers associated with the execution have met or exceeded latency numbers thresholds, or combinations of any of these. The post-run attributes 1466 and the post-run attributes success criterion may act as a filter for the reference graphs and placements database 1485 that may ensure that only PNR reference unit graphs that are known to have been successfully placed and routed, and have met or exceeded the post-run attributes success criterion are included in the reference graphs and placements database 1485.

At action 11, GNN trainer 1446 may train a GNN to generate a trained GNN 1486 using a table of reference graphs and placements, each reference unit graph in a table of reference graphs and placements, an index of a corresponding nearest matching previously placed reference unit graph entry in the table as a classification training target, and a corresponding matching score as an assessment training target. The table of reference graphs and placements may comprise the reference graphs and placements database 1485. Training may require configuring the graph neural network for each placement graph in the training set.

Figure 16A:
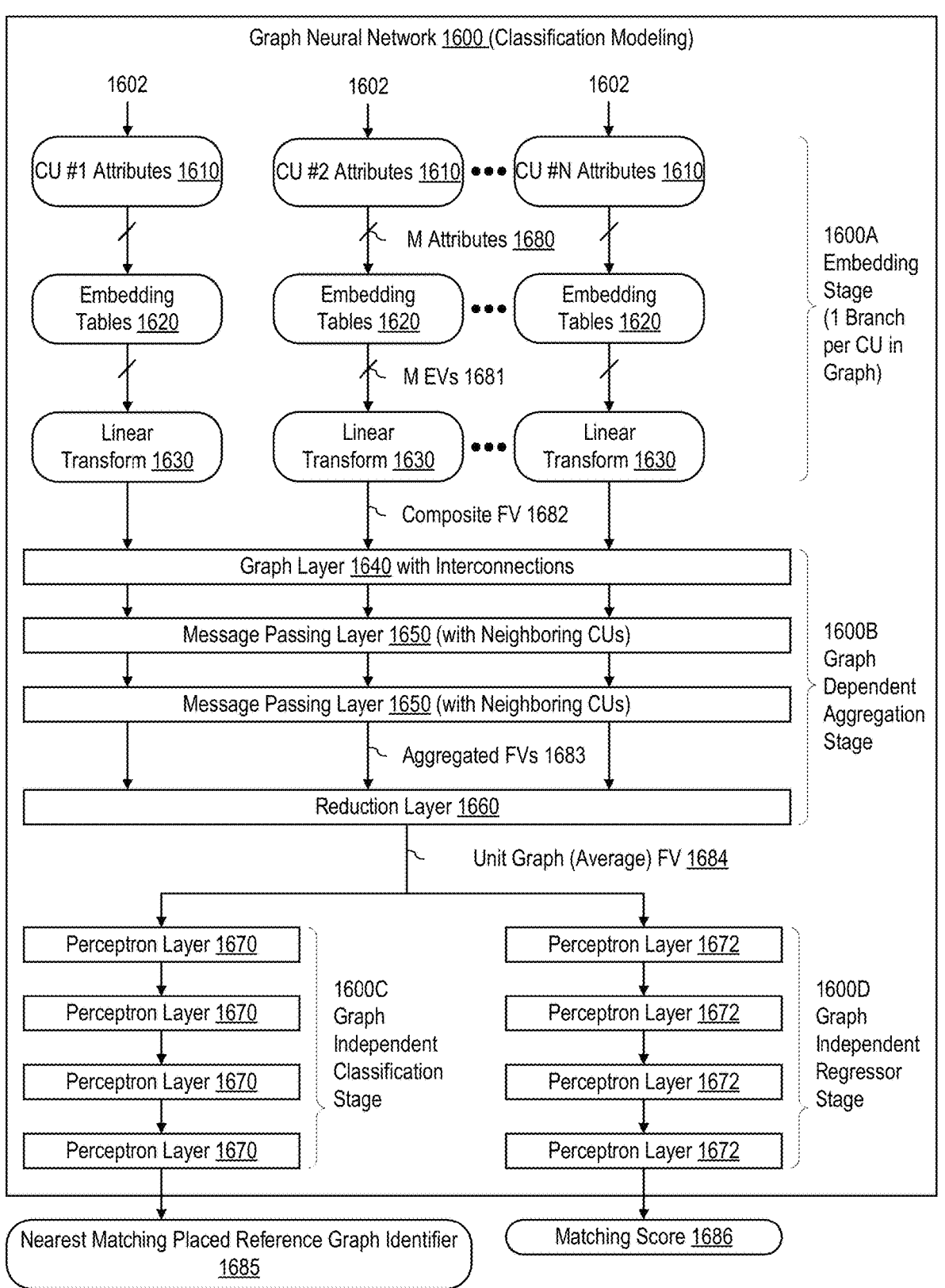
FIG. 16A is a block diagram of an example graph neural network (GNN) suitable for training a GNN using reference placement graphs and classification of placement graphs.
Figure 16B:
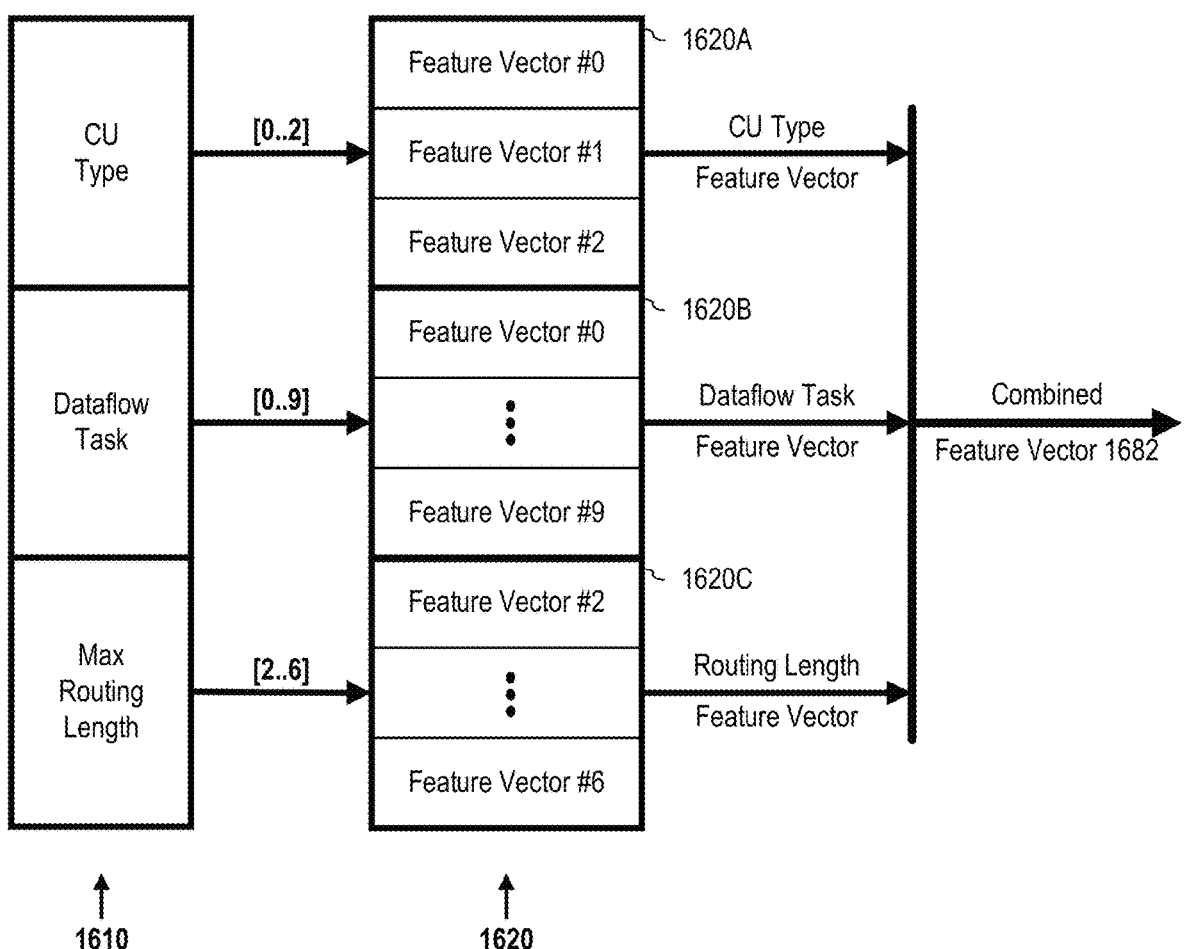
FIG. 16B is a block diagram of an example of a set of embedding tables consistent with the GNN of FIG. 16A.

Training a GNN and the GNN is described in more detail with references to FIGS. 16A and 16B.

In some embodiments, the reference graphs and placements database 1485 of known PNR solutions can be dynamically constructed or updated during online operation of the DAPR system each time a new reference unit graph 1460 is received. After performing actions 1 through 10 of the database construction flow 1400 for the new reference unit graph 1460 including adding the new PNR reference unit graph 1461 to a new entry in the reference graphs and placements database 1485, the GNN trainer 1446 may train or retrain a GNN to generate a trained or retrained GNN 1486 using the new PNR reference unit graph 1461 in the reference graphs and placements database 1485.

FIG. 15 is a flowchart illustrating an example of a computer-implemented method 1500 for training a GNN using reference unit graphs and their placement and routing for coarse-grain reconfigurable architecture (CGRA) systems. For clarity of presentation, the description that follows generally describes method 1500 in the context of the other figures in this description. However, it will be understood that method 1500 can be performed, for example, by any system, environment, software, and hardware, or a combination of systems, environments, software, and hardware, as appropriate. In some implementations, various steps of method 1500 can be run in parallel, in combination, in loops, or in any order.

At 1502, a graph neural network (GNN) is trained to predict a nearest matching subgraph identifier and a nearest matching score using a plurality of features for each previously placed reference unit graph from a database of previously placed reference unit graphs, and to produce a trained GNN. From 1502, method 1500 proceeds to 1504.

At 1504, an unplaced unit graph representing at least a portion of a dataflow graph of a high-level program is received. From 1504, method 1500 proceeds to 1506.

At 1506, a nearest matching subgraph identifier and a nearest matching score is determined for the unplaced unit graph using the trained GNN. From 1506, method 1500 proceeds to 1508.

At 1508, configurable units of the unplaced unit graph are placed onto positions in a configurable units array according to placement position attributes corresponding to a nearest matching subgraph identified by the nearest matching subgraph identifier to produce placed configurable units of the unplaced unit graph. From 1508, method 1500 proceeds to 1510.

At 1510, data and dataflow control information are routed between the configurable units of the unplaced unit graph placed onto positions in the configurable units array. From 1510, method 1500 proceeds to 1512.

At 1512, configuration data corresponding to the placed configurable units of the unplaced unit graph is generated that enables the configurable units array to implement at least a portion of the unplaced unit graph. After 1512, method 1500 stops.

FIG. 16A is a block diagram of an example graph neural network (GNN) 1600 suitable for training a GNN using placed reference unit graphs and classification of unplaced unit graphs for coarse-grain reconfigurable architecture (CGRA) systems.

As illustrated, graph neural network 1600 includes an embedding stage 1600A, an aggregation stage 1600B, a classification stage 1600C, and a regressor stage 1600D. The embedding stage 1600A and the aggregation stage 1600B of the graph neural network 1600 may be configured for specific unit graphs during training and when classifying an unplaced unit graph to identify a nearest matching previously placed reference unit graph and an associated matching score. In contrast, classification stage 1600C and regressor stage 1600D are independent of the unit graph and need not be configured for the unit graph being trained on or being classified.

The embedding stage 1600A includes a branch 1602 for each configuration unit in a unit graph whether a placed reference unit graph used during training or an unplaced unit graph used during classification. Each branch 1602 includes a configuration unit attributes register 1610, a set of embedding tables 1620 and a linear transform module 1630.

The configuration unit attributes register 1610 receives and stores a set of attributes for each configuration unit in a unit graph. Each attribute may be an index and need not be descriptive. Examples of attributes include a configurable unit type, a dataflow task, an end-to-end (e2e) attribute and a routing length. The configurable unit type specifies the type of configurable unit such as a compute unit, memory unit or switch unit. The dataflow task identifies the task assigned to the configurable unit. The e2e attribute indicates a sink unit's readiness to receive incoming packets end-to-end from the source. The higher the credit, the more spaces the unit will have to receive data. The routing length indicates the traveling latency from sender to receiver.

Referring now to FIG. 16B as well as 16A, each set of embedding tables 1620 includes a table for each attribute within the attribute register 1610. Within each attribute table a feature vector may be stored for each possible value for that attribute. For example, as shown in the example set of embedding tables illustrated in FIG. 16B, if there are three possible configuration unit types three feature vectors would be stored in the configuration unit type embedding table 1620A. Similarly, if there are 10 possible dataflow tasks, 10 feature vectors would be stored in the dataflow task embedding table 1620B. Lastly, with 5 possible routing lengths 5 feature vectors would be stored in the routing length embedding table 1620C. It is appreciated that the depicted embedding tables 1620 could each be a portion of a larger table.

Each of the linear transform modules 1630 may receive a feature vector for each of the attributes in the attribute register 1610, for example, as a combined feature vector, and generate a composite feature vector therefrom. The length of the composite feature vector may be different than individual or combined attribute feature vectors. In some cases, the linear transform modules 1630 are multi-layer perceptron's.

Each branch 1602 may have the same set of embedding tables 1620 with identical feature vector entries as well at the same linear transform module 1630 with identical (transformation) weights. Consequently, during training the learning that occurs to the feature vectors stored in the embedding tables 1620 and the weights used in the linear transform module 1630 of each branch 1602 results in training for every branch 1602.

The aggregation stage 1600B includes a graph layer 1640 and multiple message passing layers 1650 and a reduction layer 1660. The graph layer 1640 receives the composite feature vector for each configuration unit and stores it in a corresponding node in the graph neural network. The graph layer 1640 is also configured with the connectivity information from the unit graph being trained or classified. The message passing layers 1650 leverage that connectivity information to exchange and aggregate the composite feature vectors. For example, the composite feature vectors may be exchanged between configuration units that are neighbors within the placement graph and the feature vector with the maximum value may be retained. By conducting m passes of aggregation, each node in the graph neural network will retain the maximum (aggregated) composite feature vector that is within distance m within the graph neural network. The reduction layer 1660 averages all of the aggregated composite feature vectors to produce an average feature vector for the entire (placed reference or unplaced) unit graph.

The classification stage 1600C includes multiple perceptron layers 1670. The perceptron layers produce an identifier of a nearest matching placed reference graph 1685 for the unit graph such as an index of the nearest matching placed reference graph 1685 entry in a table of reference graphs and placements. The table of reference graphs and placements, for example, may comprise reference graphs and placements database 1485 as shown in FIG. 14. The table may contain N entries and an index into the table may have a value between 0 and N–1. During training the classified index of the nearest matching placed reference graph 1685 entry is compared to the actual index of the unit graph in the table of reference graphs and placements. The error is backpropagated to update the corresponding weights in the perceptron layers 1670, the linear transform modules 1630 and the entries in the embedding tables 1620. In some cases, initially, before training commences, the weights and embedding table entries may be set to random values.

The regressor stage 1600D includes multiple perceptron layers 1672. The perceptron layers produce a matching score associated with the classified index of the nearest matching placed reference graph 1685 entry. During training the classified matching score associated with the classified index of the nearest matching placed reference graph 1685 entry is compared with the actual matching score associated with the actual index of the unit graph in the table of reference graphs and placements. The error is backpropagated to update the corresponding weights in the perceptron layers 1672, the linear transform modules 1630 and the entries in the embedding tables 1620.

It should be noted that the depicted graph neural network 1600 leverages learning for the configuration units individually within a unit graph as well as the topology of the unit graph as a whole.

Nodes in a placement graph that may be used for training or estimating may correspond to a set of configurable units.

An embedding stage of the graph neural network and the trained graph neural network may include a branch for each configurable unit of the set of configurable units. Inputs to each branch of the embedding stage may include a set of configuration unit attributes for a configuration unit of the set of configurable units. The set of configuration unit attributes may include one or more of configurable unit type, a dataflow task, an e2e attribute and a routing length. Each branch of the embedding stage may use a set of embedding tables including an embedding table for each configuration unit attribute of the set of configuration unit attributes. Each branch of the embedding stage may generate a composite feature vector from a set of embedding vectors provided by the set of embedding tables used by the branch. The feature vector may be generated using a multi-layer perceptron. The set of embedding tables may include one or more of a configurable unit type table, a dataflow task table, an e2e attribute table and a routing length table.

The graph neural network and the trained graph neural network may include a graph aggregation stage. The graph aggregation stage may determine an aggregated feature vector for each node in the placement graph to produce aggregated feature vectors. The graph aggregation stage may determine the aggregated feature vectors by exchanging messages between each pair of connected nodes in the placement graph. The graph aggregation stage may conduct two or more passes of exchanging messages. The graph aggregation stage may average the aggregated feature vectors to produce an average feature vector for the placement graph. The regressor stage may estimate the throughput and the matching score associated with the nearest matching placed reference graph entry for the placement graph from the average feature vector using a multi-layer perceptron. The training module updates weights within the regressor stage and the embedding stage of the graph neural network using backpropagation.

In some embodiments, the regressor stage may utilize an empirically validated data driven cost model in identifying a matching score of a placement of a placed reference unit graph obtained by the DAPR.

In some embodiments, an adaptive machine learning model for the matching score may be trained based on an existing database of reference graphs and their corresponding throughputs and placements.

The subject matter described in this specification can be implemented to realize one or more of the following advantages. First, by starting from known place and route (PNR) solutions in a database of previously placed reference unit graphs, faster placement of unplaced unit graphs can be achieved at similar throughput and latency than ab-initio PNR solutions. Second, placement and routing of configurable units of an unplaced unit graph based on a database of previously placed reference unit graphs, referred herein as database driven place and route (DAPR), may utilize placement, routing, and post-run attributes information of one or more previously placed reference unit graphs to place at least a portion of the configurable units of the unplaced unit graph, which may reduce the number of configurable units to be placed to the remaining unplaced configurable units of the unplaced unit graph. Third, DAPR may use classification with graph neural networks (GNNs) to find a similarity match between an unplaced unit graph and a previously placed unit graph in the DAPR database of previously placed reference unit graphs. Fourth, these techniques work for both directed cyclic compute graphs and directed acyclic compute graphs. Fifth, the PNR algorithm is architecture agnostic in the global placement and scales well with the size of the network. Sixth, the database contains implicit knowledge of the placement and routing information based on prior ab-initio PNR solutions and utilizing this information may reduce the amount of compile time for mapping data-flow applications onto configurable units arrays, coarse-grained reconfigurable (CGR) type processors, and coarse-grained reconfigurable architecture (CGRA) systems. Empirical measures of compilation of data-flow applications have shown that up to 75% of compile time is dedicated to PNR. As such, the reduction of the amount of compile time achieved by utilizing the DAPR scheme for mapping data-flow applications onto configurable units arrays, CGR type processors, and CGRA systems directly results in a reduction in a portion of the up to 75% of compile time dedicated to PNR. Seventh, the techniques of DAPR may allow potential near real-time compilation of deep neural network (DNN) graphs and task-graphs onto at least one configurable units array, coarse-grained reconfigurable (CGR) type processors, and coarse-grained reconfigurable architecture (CGRA) systems by utilizing an online, ground truth referenced scheme. Eighth, the DAPR scheme has the capacity to implicitly learn globally from multiple compilations, since the CGRA is invariant, and utilize this learned knowledge in future compilations. This learned knowledge may allow the DAPR scheme to continuously improve over time and may result in improved hit-rates, better matching previously placed reference graphs, and higher matching scores during classification of an unplaced unit graph against the DAPR database.

Described implementations of the subject matter can include one or more features, alone or in combination.

For example, in a first implementation, a computer-implemented method for database driven place and route comprising: receiving an unplaced unit graph; classifying the unplaced unit graph against a database of previously placed reference unit graphs using a graph neural network (GNN) to identify a nearest matching previously placed reference unit graph of the database; placing configurable units of the unplaced unit graph onto positions in a configurable units array based on placement position attributes of at least a portion of configurable units of the nearest matching previously placed reference unit graph; and generating configuration data that enables the configurable units array to execute at least a portion of the unplaced unit graph.

The foregoing and other described implementations can each, optionally, include one or more of the following features:

A first feature, combinable with any of the following features, wherein classifying further to identify a matching score associated with the nearest matching previously placed reference unit graph, and wherein placing configurable units of the unplaced unit graph onto positions in the configurable units array comprises: determining whether the matching score is greater than an acceptance threshold for the matching score; and in response to determining that the matching score is greater than the acceptance threshold: identifying a matching subgraph of the unplaced unit graph from the nearest matching previously placed reference unit graph; and assigning placement positions of configurable units of the matching subgraph of the unplaced unit graph in the configurable units array according to placement position attributes of corresponding configurable units of at least the portion of configurable units of the nearest matching previously placed reference unit graph.

A second feature, combinable with any of the previous or following features, wherein in response to determining that the matching score is greater than the acceptance threshold further comprises: placing unmatched configurable units of the unplaced unit graph onto positions in the configurable units array within position constraints set by assigning the placement positions of the configurable units of the matching subgraph of the unplaced unit graph in the configurable units array.

A third feature, combinable with any of the previous or following features, wherein placing configurable units of the unplaced unit graph onto positions in the configurable units array further comprises, in response to determining that the matching score is less than or equal to the acceptance threshold for the matching score: placing the configurable units of the unplaced unit graph onto positions in the configurable units array.

A fourth feature, combinable with any of the previous or following features, further comprising: routing data and dataflow control information between the configurable units of the unplaced unit graph after placing the configurable units of the unplaced unit graph onto positions in the configurable units array and before generating the configuration data.

A fifth feature, combinable with any of the previous or following features, further comprising: loading the configuration data onto an instance of the configurable units array; executing at least the portion of the unplaced unit graph on the instance of the configurable units array; retrieving post-run attributes associated with executing at least the portion of the unplaced unit graph on the instance of the configurable units array; and adding at least the portion of the unplaced unit graph to the database based on the post-run attributes.

A sixth feature, combinable with any of the previous or following features, wherein the post-run attributes comprise utilization, throughput, and latency numbers associated with executing at least the portion of the unplaced unit graph on the instance of the configurable units array.

A seventh feature, combinable with any of the previous or following features, wherein the unplaced unit graph comprises a directed acyclic graph.

An eighth feature, combinable with any of the previous or following features, wherein the unplaced unit graph comprises a directed cyclic graph.

A nineth feature, combinable with any of the previous or following features, wherein the GNN comprises a graph convolutional neural network (GCN).

A tenth feature, combinable with any of the previous or following features, wherein the unplaced unit graph represents at least a portion of a dataflow graph of a high-level program.

An eleventh feature, combinable with any of the previous or following features, wherein the configurable units of the unplaced unit graph comprise memory units and compute units, and wherein the placement position attributes of at least the portion of the configurable units of the nearest matching previously placed reference unit graph comprise placed positions of the memory units and the compute units in the configurable units array.

A twelfth feature, combinable with any of the previous or following features, wherein classifying the unplaced unit graph against the database of previously placed reference unit graphs using the GNN to identify the nearest matching previously placed reference unit graph of the database further comprises: identifying, using an empirically validated data driven cost model, a matching score associated with the nearest matching previously placed reference unit graph.

In a second implementation, a system for database driven place and route, comprising: at least one processor; and one or more memories coupled to the at least one processor and storing programming instructions for execution by the at least one processor to: receive an unplaced unit graph; classify the unplaced unit graph against a database of previously placed reference unit graphs using a graph neural network (GNN) to identify a nearest matching previously placed reference unit graph of the database; place configurable units of the unplaced unit graph onto positions in a configurable units array based on placement position attributes of at least a portion of configurable units of the nearest matching previously placed reference unit graph; and generate configuration data that enables the configurable units array to execute at least a portion of the unplaced unit graph.

The foregoing and other described implementations can each, optionally, include one or more of the following features:

A first feature, combinable with any of the following features, wherein the programming instructions to classify the unplaced unit graph further to identify a matching score associated with the nearest matching previously placed reference unit graph, and wherein the programming instructions to place configurable units of the unplaced unit graph onto positions in the configurable units array further to: determine whether the matching score is greater than an acceptance threshold for the matching score; and in response to determine that the matching score is greater than the acceptance threshold: identify a matching subgraph of the unplaced unit graph from the nearest matching previously placed reference unit graph; and assign placement positions of configurable units of the matching subgraph of the unplaced unit graph in the configurable units array according to placement position attributes of corresponding configurable units of at least the portion of configurable units of the nearest matching previously placed reference unit graph.

A second feature, combinable with any of the previous or following features, wherein in response to determine that the matching score is greater than the acceptance threshold, the programming instructions further to: place unmatched configurable units of the unplaced unit graph onto positions in the configurable units array within position constraints set by assign of the placement positions of the configurable units of the matching subgraph of the unplaced unit graph in the configurable units array.

A third feature, combinable with any of the previous or following features, wherein the programming instructions to place configurable units of the unplaced unit graph onto positions in the configurable units array further to, in response to determine that the matching score is less than or equal to the acceptance threshold for the matching score, place the configurable units of the unplaced unit graph onto positions in the configurable units array.

A fourth feature, combinable with any of the previous or following features, wherein the programming instructions further to: route data and dataflow control information between the configurable units of the unplaced unit graph after the configurable units of the unplaced unit graph have been placed onto positions in the configurable units array and before the configuration data has been generated.

A fifth feature, combinable with any of the previous or following features, wherein the programming instructions further to: load the configuration data onto an instance of the configurable units array; execute at least the portion of the unplaced unit graph on the instance of the configurable units array; retrieve post-run attributes associated with executing at least the portion of the unplaced unit graph on the instance of the configurable units array; and add at least the portion of the unplaced unit graph to the database based on the post-run attributes.

A sixth feature, combinable with any of the previous or following features, wherein the post-run attributes comprise utilization, throughput, and latency numbers associated with execution of at least the portion of the unplaced unit graph on the instance of the configurable units array.

In a third implementation, a non-transitory, computer readable-medium storing one or more programming instructions executable by at least one processor to perform operations for database driven place and route comprising: receiving an unplaced unit graph; classifying the unplaced unit graph against a database of previously placed reference unit graphs using a graph neural network (GNN) to identify a nearest matching previously placed reference unit graph of the database; placing configurable units of the unplaced unit graph onto positions in a configurable units array based on placement position attributes of at least a portion of configurable units of the nearest matching previously placed reference unit graph; and generating configuration data that enables the configurable units array to execute at least a portion of the unplaced unit graph.

In a fourth implementation, a computer-implemented method for iterative database driven place and route, comprising: adding an unplaced unit graph to a priority list; selecting a current subgraph of the unplaced unit graph from the priority list; classifying the current subgraph of the unplaced unit graph against a database of previously placed reference unit graphs using a graph neural network (GNN) to identify a nearest matching previously placed reference unit graph of the database; determining a placed matching subgraph of the current subgraph of the unplaced unit graph from a placed matching subgraph of the nearest matching previously placed reference unit graph; iteratively selecting, classifying, and determining, until the priority list is empty; identifying a placement layout of configurable units of each placed matching subgraph of the unplaced unit graph onto a configurable units array; and generating configuration data that enables the configurable units array to execute at least a portion of the unplaced unit graph.

The foregoing and other described implementations can each, optionally, include one or more of the following features:

A first feature, combinable with any of the following features, wherein classifying further to identify a matching score associated with the nearest matching previously placed reference unit graph, and wherein determining the placed matching subgraph of the current subgraph of the unplaced unit graph from the placed matching subgraph of the nearest matching previously placed reference unit graph comprises: determining whether the matching score is greater than an acceptance threshold; and in response to determining that the matching score is greater than the acceptance threshold: identifying the placed matching subgraph of the nearest matching previously placed reference unit graph; and assigning placement position attributes of configurable units of the placed matching subgraph of the nearest matching previously placed reference unit graph to placement position attributes of corresponding configurable units of the placed matching subgraph of the current subgraph of the unplaced unit graph.

A second feature, combinable with any of the previous or following features, wherein in response to determining that the matching score is greater than the acceptance threshold further comprises: adding an unplaced subgraph of the current subgraph of the unplaced unit graph to the priority list, wherein the unplaced subgraph of the current subgraph of the unplaced unit graph comprises remaining unplaced configurable units of the current subgraph of the unplaced unit graph; and adding the placed matching subgraph of the current subgraph of the unplaced unit graph to a list of placed matching subgraphs.

A third feature, combinable with any of the previous or following features, wherein in response to determining that the matching score is less than or equal to the acceptance threshold: adding an unplaced subgraph of the current subgraph of the unplaced unit graph to a list of remaining unplaced subgraphs, wherein the unplaced subgraph of the current subgraph of the unplaced unit graph comprises remaining unplaced configurable units of the current subgraph of the unplaced unit graph.

A fourth feature, combinable with any of the previous or following features, wherein selecting the current subgraph of the unplaced unit graph from the priority list further comprises removing the current subgraph of the unplaced unit graph from the priority list.

A fifth feature, combinable with any of the previous or following features, further comprising ordering each placed matching subgraph in a list of placed matching subgraphs topologically using a topological sort algorithm, prior to identifying the placement layout of the configurable units of each placed matching subgraph onto the configurable units array.

A sixth feature, combinable with any of the previous or following features, wherein identifying the placement layout of the configurable units of each placed matching subgraph onto the configurable units array comprises: generating a composite graph with configurable units of the composite graph placed onto positions in the configurable units array according to placement position attributes of the configurable units of each placed matching subgraph of the nearest matching previously placed reference unit graph.

A seventh feature, combinable with any of the previous or following features, further comprising: combining configurable units of each remaining unplaced subgraph of the unplaced unit graph of a list of remaining unplaced subgraphs of the unplaced unit graph into a union of the configurable units of each remaining unplaced subgraph of the unplaced unit graph; identifying remaining configurable units to be placed from the union of the configurable units of each remaining unplaced subgraph of the unplaced unit graph; and placing the remaining configurable units to be placed onto positions in the configurable units array within position constraints set by the configurable units of the composite graph placed onto positions in the configurable units array.

An eighth feature, combinable with any of the previous or following features, wherein placing the remaining configurable units further comprises placing the remaining configurable units to be placed onto positions in the configurable units array using simulated annealing.

A nineth feature, combinable with any of the previous or following features, wherein the unplaced unit graph represents at least a portion of a dataflow graph of a high-level program.

A tenth feature, combinable with any of the previous or following features, further comprising, prior to identifying the matching score associated with the nearest matching previously placed reference unit graph: training an adaptive machine learning model for predicting the matching score based on an existing database of reference graphs and their corresponding throughputs and placements, and to produce a trained adaptive machine learning model, wherein identifying the matching score associated with the nearest matching previously placed reference unit graph utilizes the trained adaptive machine learning model to predict the matching score associated with the nearest matching previously placed reference unit graph.

An eleventh feature, combinable with any of the previous or following features, wherein the priority list is a max-heap ordered by size of each unplaced subgraph of the unplaced unit graph in the priority list, and wherein the size of each unplaced subgraph is equal to the number of nodes plus the number of edges of the unplaced subgraph.

A twelfth feature, combinable with any of the previous or following features, wherein the priority list is a max-heap, and wherein when a number of retries for iteratively selecting, classifying, and determining a particular unplaced subgraph at the top of the max-heap exceeds a retry threshold: adding each unplaced subgraph of the unplaced unit graph in the priority list to a list of remaining unplaced subgraphs of the unplaced unit graph to be placed by a free unit placer; and setting the priority list to empty.

In a fifth implementation, system for iterative database driven place and route, comprising: at least one processor; and one or more memories coupled to the at least one processor and storing programming instructions for execution by the at least one processor to: add an unplaced unit graph to a priority list; select a current subgraph of the unplaced unit graph from the priority list; classify the current subgraph of the unplaced unit graph against a database of previously placed reference unit graphs using a graph neural network (GNN) to identify a nearest matching previously placed reference unit graph of the database; determine a placed matching subgraph of the current subgraph of the unplaced unit graph from a placed matching subgraph of the nearest matching previously placed reference unit graph; iteratively select, classify, and determine, until the priority list is empty; identify a placement layout of configurable units of each placed matching subgraph of the unplaced unit graph onto a configurable units array; and generate configuration data that enables the configurable units array to execute at least a portion of the unplaced unit graph.

The foregoing and other described implementations can each, optionally, include one or more of the following features:

A first feature, combinable with any of the following features, wherein the programming instructions to classify further to identify a matching score associated with the nearest matching previously placed reference unit graph, and wherein the programming instructions to determine the placed matching subgraph of the current subgraph of the unplaced unit graph from the placed matching subgraph of the nearest matching previously placed reference unit graph further to: determine whether the matching score is greater than an acceptance threshold; and in response to determine that the matching score is greater than the acceptance threshold: identify the placed matching subgraph of the nearest matching previously placed reference unit graph; and assign placement position attributes of configurable units of the placed matching subgraph of the nearest matching previously placed reference unit graph to placement position attributes of corresponding configurable units of the placed matching subgraph of the current subgraph of the unplaced unit graph.

A second feature, combinable with any of the previous or following features, wherein in response to determine that the matching score is greater than the acceptance threshold, the programming instructions further to: add an unplaced subgraph of the current subgraph of the unplaced unit graph to the priority list, wherein the unplaced subgraph of the current subgraph of the unplaced unit graph comprises remaining unplaced configurable units of the current subgraph of the unplaced unit graph; and add the placed matching subgraph of the current subgraph of the unplaced unit graph to a list of placed matching subgraphs.

A third feature, combinable with any of the previous or following features, wherein in response to determine that the matching score is less than or equal to the acceptance threshold, the programming instructions further to: add an unplaced subgraph of the current subgraph of the unplaced unit graph to a list of remaining unplaced subgraphs, wherein the unplaced subgraph of the current subgraph of the unplaced unit graph comprises remaining unplaced configurable units of the current subgraph of the unplaced unit graph.

A fourth feature, combinable with any of the previous or following features, wherein the programming instructions to select the current subgraph of the unplaced unit graph from the priority list further to remove the current subgraph of the unplaced unit graph from the priority list.

A fifth feature, combinable with any of the previous or following features, wherein the programming instructions further to order each placed matching subgraph in a list of placed matching subgraphs topologically using a topological sort algorithm, prior to identifying the placement layout of the configurable units of each placed matching subgraph onto the configurable units array.

A sixth feature, combinable with any of the previous or following features, wherein the programming instructions to identify the placement layout of the configurable units of each placed matching subgraph onto the configurable units array further to: generate a composite graph with configurable units of the composite graph placed onto positions in the configurable units array according to placement position attributes of the configurable units of each placed matching subgraph of the nearest matching previously placed reference unit graph.

A seventh feature, combinable with any of the previous or following features, wherein the programming instructions further to: combine configurable units of each remaining unplaced subgraph of the unplaced unit graph of a list of remaining unplaced subgraphs of the unplaced unit graph into a union of the configurable units of each remaining unplaced subgraph of the unplaced unit graph; identify remaining configurable units to be placed from the union of the configurable units of each remaining unplaced subgraph of the unplaced unit graph; and place the remaining configurable units to be placed onto positions in the configurable units array within position constraints set by the configurable units of the composite graph placed onto positions in the configurable units array.

An eighth feature, combinable with any of the previous or following features, wherein the programming instructions to place the remaining configurable units further to place the remaining configurable units to be placed onto positions in the configurable units array using simulated annealing.

A nineth feature, combinable with any of the previous or following features, wherein the unplaced unit graph represents at least a portion of a dataflow graph of a high-level program.

In a sixth implementation, a non-transitory, computer readable-medium storing one or more programming instructions executable by at least one processor to perform operations for iterative database driven place and route, comprising: adding an unplaced unit graph to a priority list; selecting a current subgraph of the unplaced unit graph from the priority list; classifying the current subgraph of the unplaced unit graph against a database of previously placed reference unit graphs using a graph neural network (GNN) to identify a nearest matching previously placed reference unit graph of the database; determining a placed matching subgraph of the current subgraph of the unplaced unit graph from a placed matching subgraph of the nearest matching previously placed reference unit graph; iteratively selecting, classifying, and determining, until the priority list is empty; identifying a placement layout of configurable units of each placed matching subgraph of the unplaced unit graph onto a configurable units array; and generating configuration data that enables the configurable units array to execute at least a portion of the unplaced unit graph.

In a seventh implementation, a computer-implemented method for training a graph neural network for database driven place and route, comprising: training a graph neural network (GNN) to predict a nearest matching subgraph identifier and a nearest matching score using a plurality of features for each previously placed reference unit graph from a database of previously placed reference unit graphs, and to produce a trained GNN; receiving an unplaced unit graph; determining a nearest matching subgraph identifier and a nearest matching score for the unplaced unit graph using the trained GNN; placing configurable units of the unplaced unit graph onto positions in a configurable units array according to placement position attributes corresponding to a nearest matching subgraph identified by the nearest matching subgraph identifier to produce placed configurable units of the unplaced unit graph; and generating configuration data corresponding to the placed configurable units of the unplaced unit graph that enables the configurable units array to implement at least a portion of the unplaced unit graph.

The foregoing and other described implementations can each, optionally, include one or more of the following features:

A first feature, combinable with any of the following features, wherein training the GNN further comprises using each corresponding nearest matching subgraph identifier and nearest matching score as training targets to produce the trained GNN.

A second feature, combinable with any of the previous or following features, wherein nodes in a unit graph used for training or placing correspond to a set of configurable units.

A third feature, combinable with any of the previous or following features, wherein an embedding stage of the GNN and the trained GNN comprises a branch for each configurable unit of a set of configurable units, wherein inputs to each branch of the embedding stage comprise a set of configuration unit attributes for a configuration unit of the set of configurable units, wherein the set of configuration unit attributes comprises one or more of configurable unit type, a dataflow task, an end-to-end (e2e) attribute, and a routing length, wherein each branch of the embedding stage uses a set of embedding tables comprising an embedding table for each configuration unit attribute of the set of configuration unit attributes, wherein each branch of the embedding stage generates a composite feature vector from a set of embedding vectors provided by the set of embedding tables used by the branch, wherein the composite feature vector is generated using a multi-layer perceptron, and wherein the set of embedding tables comprises one or more of a configurable unit type table, a dataflow task table, an e2e attribute table, and a routing length table.

A fourth feature, combinable with any of the previous or following features, wherein the GNN and the trained GNN comprise a graph aggregation stage, wherein the graph aggregation stage determines an aggregated feature vector for each node in a unit graph to produce aggregated feature vectors, wherein the graph aggregation stage determines the aggregated feature vectors by exchanging messages between each pair of connected nodes in the unit graph, wherein the graph aggregation stage conducts two or more passes of exchanging messages, and wherein the graph aggregation stage averages the aggregated feature vectors to produce an average feature vector for the unit graph.

A fifth feature, combinable with any of the previous or following features, wherein a classification stage predicts a nearest matching subgraph identifier for a unit graph from an average feature vector using a multi-layer perceptron, and wherein a regressor stage predicts a nearest matching score for the unit graph from the average feature vector using a multi-layer perceptron.

A sixth feature, combinable with any of the previous or following features, wherein weights within a classification stage, a regressor stage, and an embedding stage of the GNN are updated using backpropagation.

A seventh feature, combinable with any of the previous or following features, wherein construction of the database of previously placed reference unit graphs comprises: placing and routing, using an ab-initio architecture agnostic place and route algorithm, configurable units of an unplaced reference unit graph onto positions in a configurable units array, wherein placing and routing associates the unplaced reference unit graph to a placed and routed reference unit graph; generating configuration data for placement positions and routed data and dataflow control information for the placed and routed reference unit graph; loading the configuration data onto an instance of the configurable units array of a course-grained reconfigurable processor; executing the placed and routed reference unit graph on the instance of the configurable units array of the course-grained reconfigurable processor; retrieving post-run attributes associated with executing the placed and routed reference unit graph on the instance of the configurable units array; and adding the placed and routed reference unit graph to a new entry in the database of previously placed reference unit graphs including placement position attributes of corresponding configurable units in the placed and routed reference unit graph and the post-run attributes, wherein entries in the database of previously placed reference unit graphs form training data for training the GNN.

In an eighth implementation, a system for training a graph neural network for database driven place and route, comprising: at least one processor; and one or more memories coupled to the at least one processor and storing programming instructions for execution by the at least one processor to: train a graph neural network (GNN) to predict a nearest matching subgraph identifier and a nearest matching score using a plurality of features for each previously placed reference unit graph from a database of previously placed reference unit graphs, and to produce a trained GNN; receive an unplaced unit graph; determine a nearest matching subgraph identifier and a nearest matching score for the unplaced unit graph using the trained GNN; place configurable units of the unplaced unit graph onto positions in a configurable units array according to placement position attributes corresponding to a nearest matching subgraph identified by the nearest matching subgraph identifier to produce placed configurable units of the unplaced unit graph; and generate configuration data corresponding to the placed configurable units of the unplaced unit graph that enables the configurable units array to implement at least a portion of the unplaced unit graph.

The foregoing and other described implementations can each, optionally, include one or more of the following features:

A first feature, combinable with any of the following features, wherein the programming instructions to train the GNN further to use each corresponding nearest matching subgraph identifier and nearest matching score as training targets to produce the trained GNN.

A second feature, combinable with any of the previous or following features, wherein nodes in a unit graph used to train or place correspond to a set of configurable units.

A third feature, combinable with any of the previous or following features, wherein an embedding stage of the GNN and the trained GNN comprises a branch for each configurable unit of a set of configurable units, wherein inputs to each branch of the embedding stage comprise a set of configuration unit attributes for a configuration unit of the set of configurable units, wherein the set of configuration unit attributes comprises one or more of configurable unit type, a dataflow task, an end-to-end (e2e) attribute, and a routing length, wherein each branch of the embedding stage uses a set of embedding tables comprising an embedding table for each configuration unit attribute of the set of configuration unit attributes, wherein each branch of the embedding stage generates a composite feature vector from a set of embedding vectors provided by the set of embedding tables used by the branch, wherein the composite feature vector is generated using a multi-layer perceptron, and wherein the set of embedding tables comprises one or more of a configurable unit type table, a dataflow task table, an e2e attribute table, and a routing length table.

A fourth feature, combinable with any of the previous or following features, wherein the GNN and the trained GNN comprise a graph aggregation stage, wherein the graph aggregation stage determines an aggregated feature vector for each node in a unit graph to produce aggregated feature vectors, wherein the graph aggregation stage determines the aggregated feature vectors by exchanging messages between each pair of connected nodes in the unit graph, wherein the graph aggregation stage conducts two or more passes of exchanging messages, and wherein the graph aggregation stage averages the aggregated feature vectors to produce an average feature vector for the unit graph.

A fifth feature, combinable with any of the previous or following features, wherein a classification stage predicts a nearest matching subgraph identifier for a unit graph from an average feature vector using a multi-layer perceptron, and wherein a regressor stage predicts a nearest matching score for the unit graph from the average feature vector using a multi-layer perceptron.

A sixth feature, combinable with any of the previous or following features, wherein weights within a classification stage, a regressor stage, and an embedding stage of the GNN are updated using backpropagation.

In a nineth implementation, a non-transitory, computer readable-medium storing one or more programming instructions executable by at least one processor to perform operations for training a graph neural network for database driven place and route, comprising: training a graph neural network (GNN) to predict a nearest matching subgraph identifier and a nearest matching score using a plurality of features for each previously placed reference unit graph from a database of previously placed reference unit graphs, and to produce a trained GNN; receiving an unplaced unit graph; determining a nearest matching subgraph identifier and a nearest matching score for the unplaced unit graph using the trained GNN; placing configurable units of the unplaced unit graph onto positions in a configurable units array according to placement position attributes corresponding to a nearest matching subgraph identified by the nearest matching subgraph identifier to produce placed configurable units of the unplaced unit graph; and generating configuration data corresponding to the placed configurable units of the unplaced unit graph that enables the configurable units array to implement at least a portion of the unplaced unit graph The foregoing and other described implementations can each, optionally, include one or more of the following features:

A first feature, combinable with any of the following features, wherein training the GNN further comprises using each corresponding nearest matching subgraph identifier and nearest matching score as training targets to produce the trained GNN.

A second feature, combinable with any of the previous or following features, wherein nodes in a unit graph used for training or placing correspond to a set of configurable units.

A third feature, combinable with any of the previous or following features, wherein an embedding stage of the GNN and the trained GNN comprises a branch for each configurable unit of a set of configurable units, wherein inputs to each branch of the embedding stage comprise a set of configuration unit attributes for a configuration unit of the set of configurable units, wherein the set of configuration unit attributes comprises one or more of configurable unit type, a dataflow task, an end-to-end (e2e) attribute, and a routing length, wherein each branch of the embedding stage uses a set of embedding tables comprising an embedding table for each configuration unit attribute of the set of configuration unit attributes, wherein each branch of the embedding stage generates a composite feature vector from a set of embedding vectors provided by the set of embedding tables used by the branch, wherein the composite feature vector is generated using a multi-layer perceptron, and wherein the set of embedding tables comprises one or more of a configurable unit type table, a dataflow task table, an e2e attribute table, and a routing length table.

A fourth feature, combinable with any of the previous or following features, wherein the GNN and the trained GNN comprise a graph aggregation stage, wherein the graph aggregation stage determines an aggregated feature vector for each node in a unit graph to produce aggregated feature vectors, wherein the graph aggregation stage determines the aggregated feature vectors by exchanging messages between each pair of connected nodes in the unit graph, wherein the graph aggregation stage conducts two or more passes of exchanging messages, and wherein the graph aggregation stage averages the aggregated feature vectors to produce an average feature vector for the unit graph.

A fifth feature, combinable with any of the previous or following features, wherein a classification stage predicts a nearest matching subgraph identifier for a unit graph from an average feature vector using a multi-layer perceptron, and wherein a regressor stage predicts a nearest matching score for the unit graph from the average feature vector using a multi-layer perceptron.

The preceding description is presented to enable the making and use of the technology disclosed. Various modifications, alterations, and permutations of the disclosed implementations can be made and will be readily apparent to those of ordinary skill in the art, and the general principles defined can be applied to other implementations and applications, without departing from the scope of the present disclosure. In some instances, one or more technical details that are unnecessary to obtain an understanding of the described subject matter and that are within the skill of one of ordinary skill in the art may be omitted so as to not obscure one or more described implementations. The present disclosure is not intended to be limited to the described or illustrated implementations, but to be accorded the widest scope consistent with the described principles and features.

While this specification contains many specific implementation details, these should not be construed as limitations on the scope of any inventive concept or on the scope of what can be claimed, but rather as descriptions of features that can be specific to particular implementations of particular inventive concepts. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features can be described as acting in certain combinations and even initially claimed as such, one or more features from a claimed combination can, in some cases, be excised from the combination, and the claimed combination can be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations can be considered optional), to achieve desirable results. In certain circumstances, multitasking or parallel processing (or a combination of multitasking and parallel processing) can be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

The invention claimed is:

1. A computer-implemented method for database driven place and route of an unplaced unit graph onto a configurable units array comprising:

receiving an unplaced unit graph;

classifying the unplaced unit graph against a database of previously placed reference unit graphs using a graph neural network (GNN) to identify a nearest matching previously placed reference unit graph of the database;

placing configurable units of the unplaced unit graph onto positions in a configurable units array based on placement position attributes of at least a portion of configurable units of the nearest matching previously placed reference unit graph; and generating configuration data that enables the configurable units array to execute at least a portion of the unplaced unit graph.

2. The computer-implemented method of claim 1, wherein classifying further to identify a matching score associated with the nearest matching previously placed reference unit graph, and wherein placing configurable units of the unplaced unit graph onto positions in the configurable units array comprises:

determining whether the matching score is greater than an acceptance threshold for the matching score; and in response to determining that the matching score is greater than the acceptance threshold:

identifying a matching subgraph of the unplaced unit graph from the nearest matching previously placed reference unit graph; and assigning placement positions of configurable units of the matching subgraph of the unplaced unit graph in the configurable units array according to placement position attributes of corresponding configurable units of at least the portion of configurable units of the nearest matching previously placed reference unit graph.

3. The computer-implemented method of claim 2, wherein in response to determining that the matching score is greater than the acceptance threshold further comprises:

placing unmatched configurable units of the unplaced unit graph onto positions in the configurable units array within position constraints set by assigning the placement positions of the configurable units of the matching subgraph of the unplaced unit graph in the configurable units array.

4. The computer-implemented method of claim 2, wherein placing configurable units of the unplaced unit graph onto positions in the configurable units array further comprises, in response to determining that the matching score is less than or equal to the acceptance threshold for the matching score:

placing the configurable units of the unplaced unit graph onto positions in the configurable units array.

5. The computer-implemented method of claim 1, further comprising: routing data and dataflow control information between the configurable units of the unplaced unit graph after placing the configurable units of the unplaced unit graph onto positions in the configurable units array and before generating the configuration data.

6. The computer-implemented method of claim 1, further comprising:

loading the configuration data onto an instance of the configurable units array;

executing at least the portion of the unplaced unit graph on the instance of the configurable units array;

retrieving post-run attributes associated with executing at least the portion of the unplaced unit graph on the instance of the configurable units array; and adding at least the portion of the unplaced unit graph to the database based on the post-run attributes.

7. The computer-implemented method of claim 6, wherein the post-run attributes comprise utilization, throughput, and latency numbers associated with executing at least the portion of the unplaced unit graph on the instance of the configurable units array.

8. The computer-implemented method of claim 1, wherein the unplaced unit graph comprises a directed acyclic graph.

9. The computer-implemented method of claim 1, wherein the unplaced unit graph comprises a directed cyclic graph.

10. The computer-implemented method of claim 1, wherein the GNN comprises a graph convolutional neural network (GCN).

11. The computer-implemented method of claim 1, wherein the unplaced unit graph represents at least a portion of a dataflow graph of a high-level program.

12. The computer-implemented method of claim 1, wherein the configurable units of the unplaced unit graph comprise memory units and compute units, and wherein the placement position attributes of at least the portion of the configurable units of the nearest matching previously placed reference unit graph comprise placed positions of the memory units and the compute units in the configurable units array.

13. The computer-implemented method of claim 1, wherein classifying the unplaced unit graph against the database of previously placed reference unit graphs using the GNN to identify the nearest matching previously placed reference unit graph of the database further comprises:

identifying, using an empirically validated data driven cost model, a matching score associated with the nearest matching previously placed reference unit graph.

14. A system for database driven place and route of an unplaced unit graph onto a configurable units array, comprising:

at least one processor; and one or more memories coupled to the at least one processor and storing programming instructions for execution by the at least one processor to:

receive an unplaced unit graph;

classify the unplaced unit graph against a database of previously placed reference unit graphs using a graph neural network (GNN) to identify a nearest matching previously placed reference unit graph of the database;

place configurable units of the unplaced unit graph onto positions in a configurable units array based on placement position attributes of at least a portion of configurable units of the nearest matching previously placed reference unit graph; and generate configuration data that enables the configurable units array to execute at least a portion of the unplaced unit graph.

15. The system of claim 14, wherein the programming instructions to classify the unplaced unit graph further to identify a matching score associated with the nearest matching previously placed reference unit graph, and wherein the programming instructions to place configurable units of the unplaced unit graph onto positions in the configurable units array further to:

determine whether the matching score is greater than an acceptance threshold for the matching score; and in response to determine that the matching score is greater than the acceptance threshold:

identify a matching subgraph of the unplaced unit graph from the nearest matching previously placed reference unit graph; and assign placement positions of configurable units of the matching subgraph of the unplaced unit graph in the configurable units array according to placement position attributes of corresponding configurable units of at least the portion of configurable units of the nearest matching previously placed reference unit graph.

16. The system of claim 15, wherein in response to determine that the matching score is greater than the acceptance threshold, the programming instructions further to:

place unmatched configurable units of the unplaced unit graph onto positions in the configurable units array within position constraints set by assign of the placement positions of the configurable units of the matching subgraph of the unplaced unit graph in the configurable units array.

17. The system of claim 15, wherein the programming instructions to place configurable units of the unplaced unit graph onto positions in the configurable units array further to, in response to determine that the matching score is less than or equal to the acceptance threshold for the matching score, place the configurable units of the unplaced unit graph onto positions in the configurable units array.

18. The system of claim 14, wherein the programming instructions further to: route data and dataflow control information between the configurable units of the unplaced unit graph after the configurable units of the unplaced unit graph have been placed onto positions in the configurable units array and before the configuration data has been generated.

19. The system of claim 14, wherein the programming instructions further to:

load the configuration data onto an instance of the configurable units array;

execute at least the portion of the unplaced unit graph on the instance of the configurable units array;

retrieve post-run attributes associated with executing at least the portion of the unplaced unit graph on the instance of the configurable units array; and add at least the portion of the unplaced unit graph to the database based on the post-run attributes.

20. A non-transitory, computer readable-medium storing one or more programming instructions executable by at least one processor to perform operations for database driven place and route of an unplaced unit graph onto a configurable units array comprising:

receiving an unplaced unit graph;

classifying the unplaced unit graph against a database of previously placed reference unit graphs using a graph neural network (GNN) to identify a nearest matching previously placed reference unit graph of the database;

placing configurable units of the unplaced unit graph onto positions in a configurable units array based on placement position attributes of at least a portion of configurable units of the nearest matching previously placed reference unit graph; and generating configuration data that enables the configurable units array to execute at least a portion of the unplaced unit graph.

* * * * *